US012776357B2

(12) United States Patent
Sakai et al.

(10) Patent No.: US 12,776,357 B2
(45) Date of Patent: Oct. 27, 2026

(54) MAGNETORESISTIVE EFFECT MEMORY

(71) Applicant: SONY SEMICONDUCTOR SOLUTIONS CORPORATION, Kanagawa (JP)

(72) Inventors: Lui Sakai, Kanagawa (JP); Yutaka Higo, Kanagawa (JP); Keizo Hiraga, Kanagawa (JP); Masanori Hosomi, Kanagawa (JP)

(73) Assignee: SONY SEMICONDUCTOR SOLUTIONS CORPORATION, Tokyo (JP)

( * ) Notice: Subject to any disclaimer, the term of this patent is extended or adjusted under 35 U.S.C. 154(b) by 108 days.

(21) Appl. No.: 18/835,824

(22) PCT Filed: Jan. 19, 2023

(86) PCT No.: PCT/JP2023/001497
§ 371 (c)(1),
(2) Date: Aug. 5, 2024

(87) PCT Pub. No.: WO2023/153162
PCT Pub. Date: Aug. 17, 2023

(65) Prior Publication Data

US 2025/0140297 A1 May 1, 2025

(30) Foreign Application Priority Data

Feb. 10, 2022 (JP) ................................ 2022-019641

(51) Int. Cl.
*G11C 16/04* (2006.01)
*G11C 11/16* (2006.01)

(52) U.S. Cl.
CPC ...... *G11C 11/1675* (2013.01); *G11C 11/1673* (2013.01)

(58) Field of Classification Search
CPC ........................ G11C 11/1675; G11C 11/1673
See application file for complete search history.

(56) References Cited

U.S. PATENT DOCUMENTS 8,134,864 B2 * 3/2012 Victora ................ G11C 11/161 365/158
2008/0089118 A1 * 4/2008 Kajiyama ............. B82Y 10/00 365/158
2010/0238718 A1 * 9/2010 Asao ...................... H10N 50/10 365/158

FOREIGN PATENT DOCUMENTS

JP 2018-092696 A 6/2018
JP 2019-021356 A 2/2019

OTHER PUBLICATIONS

International Search Report and Written Opinion of PCT Application No. PCT/JP2023/001497, issued on Mar. 28, 2023, 08 pages of ISRWO.

(Continued)

*Primary Examiner* — Pho M Luu
(74) *Attorney, Agent, or Firm* — CHIP LAW GROUP

(57) ABSTRACT

A magnetoresistive effect memory including a magnetoresistive element and a write circuit is provided. The magnetoresistive element includes a fixed layer whose magnetization direction is fixed and a recording layer whose magnetization direction changes. The write circuit reverses magnetization of the recording layer so that a resistance value of the magnetoresistive element is gradually changed between a low resistance value and a high resistance value. The magnetization of the recording layer rotates by precession around a magnetic field in a plane direction of the layer in a case where a voltage is applied to the magnetoresistive element. The write circuit reverses the magnetization of the recording layer so that the resistance value of the magnetoresistive element is switched from the high resistance (Continued)

value to the low resistance value based on application of a current limited so as to have a specific magnitude to the magnetoresistive element.

10 Claims, 19 Drawing Sheets

(56) References Cited

OTHER PUBLICATIONS

Wu, et al., "Deterministic and field-free voltage-controlled MRAM for high performance and low power applications", Researchgate, 2020 IEEE Symposium on VLSI Technology, Jul. 16, 2020, pp. 3.

* cited by examiner

FIG. 11A High→Low

FIG. 11B Low→High

High→High
INITIALIZATION
VERIFICATION READING
VOLTAGE V
TIME t
CORRESPONDING TO W1
W2

High→Low
VOLTAGE V
TIME t
CORRESPONDING TO W1

Low→High
VOLTAGE V
NO CHANGE
TIME t
W2

Low→Low
VOLTAGE V
TIME t
t31
t32
t33
t34
t35
t36

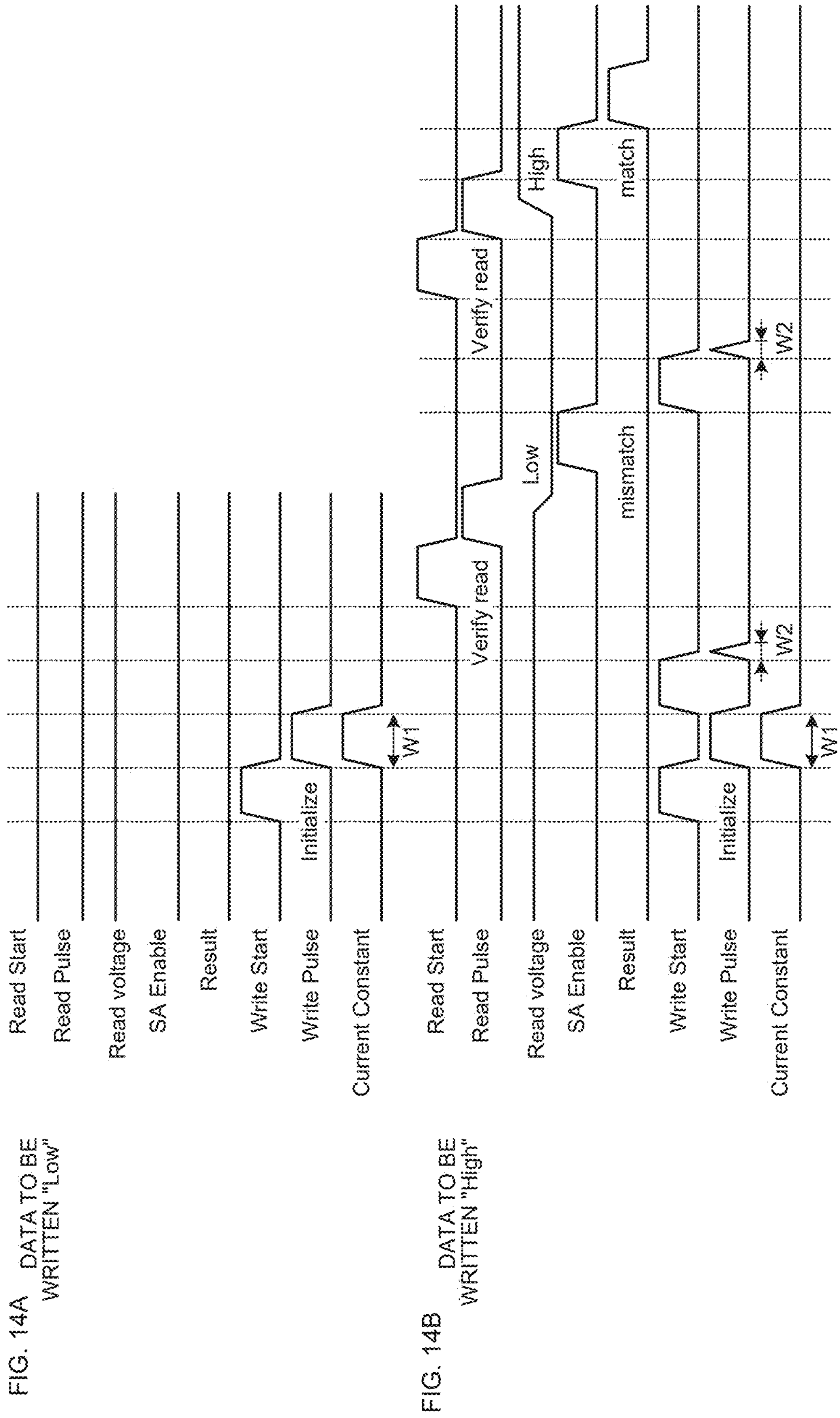
FIG. 14A DATA TO BE WRITTEN "Low"
FIG. 14B DATA TO BE WRITTEN "High"

High→High
NO CHANGE
VOLTAGE V
TIME t

High→Low
VOLTAGE V
VERIFICATION READING
TIME t
CORRESPONDING TO W1

Low→High
INITIALIZATION
VOLTAGE V
TIME t
W3

Low→Low
VOLTAGE V
VERIFICATION READING
TIME t
W3
CORRESPONDING TO W1
t41
t42
t43
t44
t45
t46

FIG. 18A DATA TO BE WRITTEN "Low"
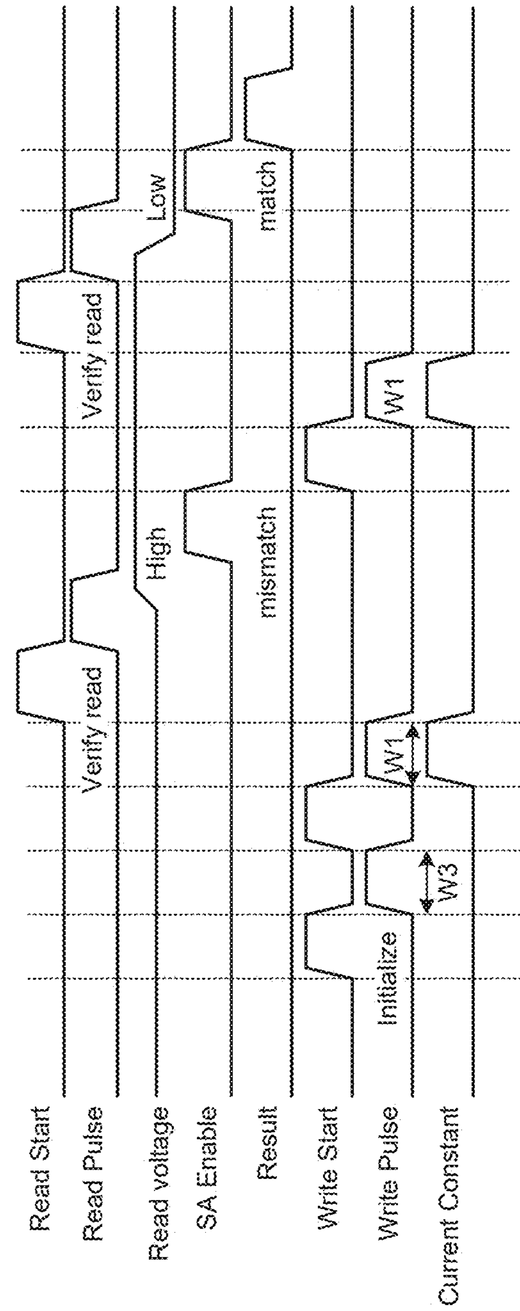
FIG. 18B DATA TO BE WRITTEN "High"
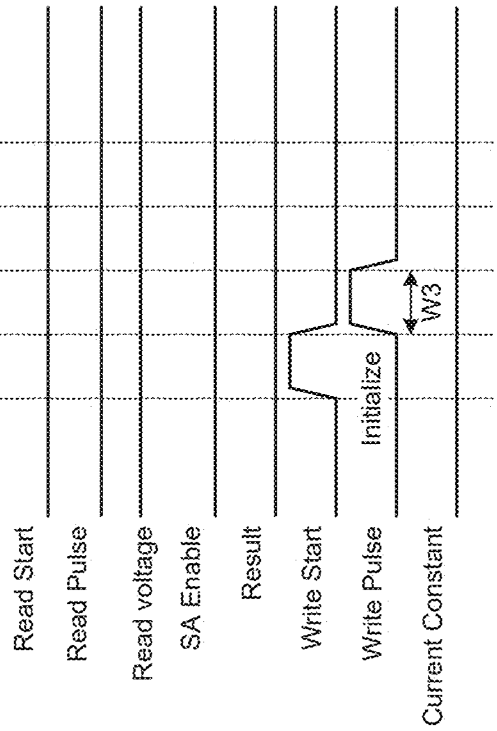

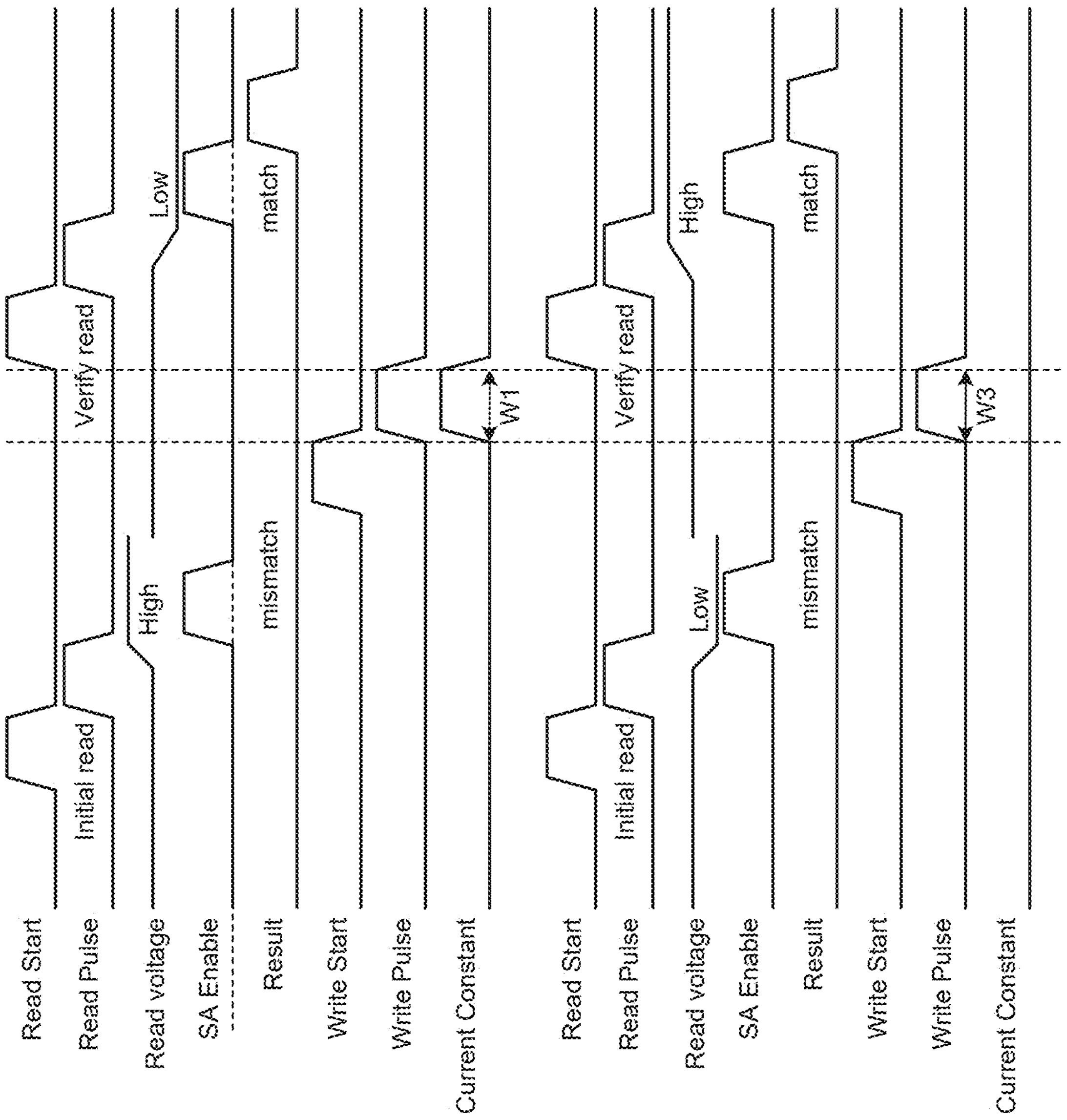
FIG. 20A DATA TO BE WRITTEN "Low"
FIG. 20B DATA TO BE WRITTEN "High"

MAGNETORESISTIVE EFFECT MEMORY

CROSS REFERENCE TO RELATED APPLICATIONS

This application is a U.S. National Phase of International Patent Application No. PCT/JP2023/001497 filed on Jan. 19, 2023, which claims priority benefit of Japanese Patent Application No. JP 2022-019641 filed in the Japan Patent Office on Feb. 10, 2022. Each of the above-referenced applications is hereby incorporated herein by reference in its entirety.

FIELD

The present disclosure relates to a magnetoresistive effect memory.

BACKGROUND

For example, Patent Literature 1 discloses a technique of reversing magnetization by applying a pulse voltage to an MTJ element having a VCMA effect. The VCMA is voltage-controlled magnetic anisotropy, and the MTJ is a magnetic tunnel junction.

CITATION LIST

Patent Literature

Patent Literature 1: JP 2018-92696 A

Non Patent Literature

Non Patent Literature 1: Y. C. Wu et al., "Deterministic and field-free voltage-controlled MRAM for high performance and low power applications" 2020 IEEE Symposium on VLSI Technology, Jul. 16, 2020

SUMMARY

Technical Problem

A magnetization reversal period is very short, and pulse control is often difficult.

One aspect of the present disclosure facilitates pulse control for reversing magnetization.

Solution to Problem

A magnetoresistive effect memory according to one aspect of the present disclosure includes: a magnetoresistive element including a fixed layer whose magnetization direction is fixed and a recording layer whose magnetization direction changes; and a write circuit that reverses magnetization of the recording layer so that a resistance value of the magnetoresistive element is switched between a low resistance value and a high resistance value, wherein the magnetization of the recording layer rotates by precession around a magnetic field in a plane direction of the layer when a voltage is applied to the magnetoresistive element, the resistance value of the magnetoresistive element gradually changes between the low resistance value and the high resistance value during the rotation of the magnetization of the recording layer, and the write circuit reverses the magnetization of the recording layer so that the resistance value of the magnetoresistive element is switched from the high resistance value to the low resistance value by applying a current limited so as to have a predetermined magnitude to the magnetoresistive element.

BRIEF DESCRIPTION OF DRAWINGS

FIGS. 14A and 14B are diagrams illustrating an example of control of writing data into the memory cell 10 in the third embodiment.

FIGS. 18A and 18B are diagrams illustrating an example of control of writing data into the memory cell 10 in the fourth embodiment.

FIGS. 20A and 20B are diagrams illustrating an example of control of writing data into a memory cell 10 in a fifth embodiment.

DESCRIPTION OF EMBODIMENTS

Figure 1:
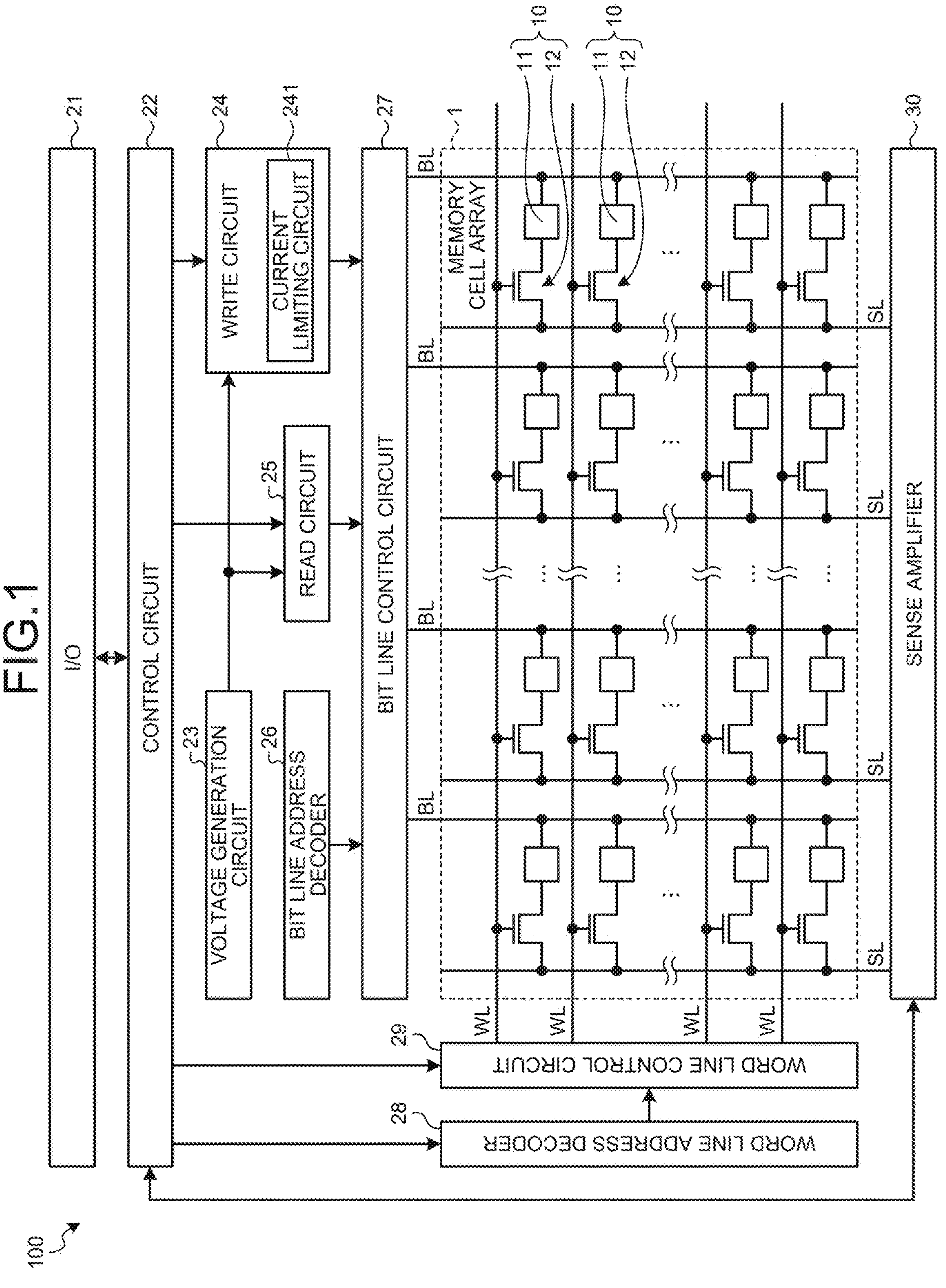
FIG. 1 is a block diagram illustrating an example of a schematic configuration of a magnetoresistive effect memory 100 according to a first embodiment.

Hereinafter, embodiments of the present disclosure will be described in detail with reference to the drawings. Note that in the following embodiments, the same elements are denoted by the same reference numerals, and redundant description will be omitted.

The present disclosure will be described according to the following order of items.

1. First Embodiment
2. Second Embodiment
3. Third Embodiment
4. Fourth Embodiment
5. Fifth Embodiment
6. Example Effects

1. First Embodiment

FIG. 1 is a block diagram illustrating an example of a schematic configuration of a magnetoresistive effect memory 100 according to a first embodiment. The magnetoresistive effect memory 100 is a semiconductor storage device using a magnetoresistive element 11 as a storage element. The magnetoresistive effect memory 100 includes a memory cell array 1.

The memory cell array 1 includes a plurality of memory cells 10 arranged two-dimensionally. Each memory cell 10 is connected to a bit line BL, a source line SL, and a word line WL. Details of the memory cell 10 will be described later again with reference to FIG. 2 and the like.

Besides the memory cell array 1, the magnetoresistive effect memory 100 includes various peripheral circuits/elements. As the peripheral circuits/elements included in the memory cell array 1, an I/O 21, a control circuit 22, a voltage generation circuit 23, a write circuit 24, a read circuit 25, a bit line address decoder 26, a bit line control circuit 27, a word line address decoder 28, a word line control circuit 29, and a sense amplifier 30 are illustrated in FIG. 1. The bit line control circuit 27 is connected to the bit line BL. The word line control circuit 29 is connected to the word line WL. The sense amplifier 30 is connected to the source line SL. Since a basic configuration itself of such a memory is known, it will be briefly described below.

A command related to reading and writing of data, an address of the memory cell 10 to be accessed, data, and the like are transferred between an element (for example, a CPU or the like) outside the magnetoresistive effect memory 100 and the control circuit 22 of the magnetoresistive effect memory 100 via the I/O 21.

The control circuit 22 performs control related to reading and writing of data in the memory cell 10 in response to the command.

The voltage generation circuit 23 generates a voltage (for example, a pulse voltage) used to read and write data from and into the memory cell 10. Note that it is assumed that a voltage necessary for circuit operation is separately provided.

The write circuit 24 controls a voltage and a current (for example, a pulse voltage and a pulse current) used for writing data into the memory cell 10. Details will be described later.

The read circuit 25 controls a voltage (for example, a pulse voltage) used for reading data from the memory cell 10, specifically, for detecting a resistance value of the magnetoresistive element 11.

The bit line address decoder 26 obtains an address of the bit line BL corresponding to the address received by the I/O 21 described above.

The bit line control circuit 27 selects and controls the bit line BL corresponding to the address of the bit line address decoder 26. Writing of data into the memory cell 10 by the write circuit 24 and reading of data from the memory cell 10 by the read circuit 25 are performed via the bit line control circuit 27 and the like.

The word line address decoder 28 obtains an address of the word line WL corresponding to the address received by the I/O 21 described above.

The word line control circuit 29 selects and controls the word line WL corresponding to the address of the word line address decoder 28.

The sense amplifier 30 detects data read from the memory cell 10 by the read circuit 25, specifically, the resistance value of the magnetoresistive element 11.

The memory cell 10 will be described again with reference to FIG. 2 and subsequent drawings.

Figure 2:
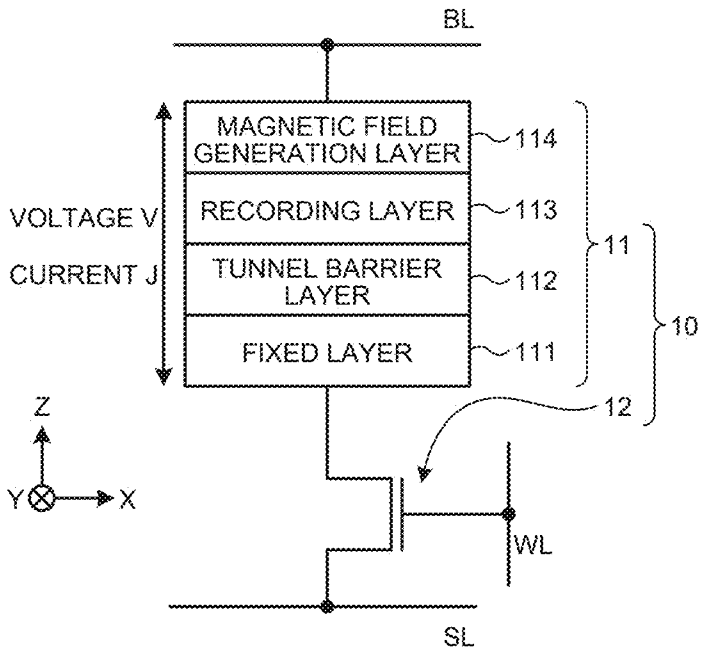
FIG. 2 is a diagram illustrating an example of a schematic configuration of a memory cell 10.

FIG. 2 is a diagram illustrating an example of a schematic configuration of the memory cell 10. The memory cell 10 includes the magnetoresistive element 11 and a selection transistor 12. The magnetoresistive element 11 and the selection transistor 12 are connected in series between the bit line BL and the source line SL.

The magnetoresistive element 11 is an MIJ element and has a laminated structure. For convenience of description, an XYZ coordinate system for the magnetoresistive element 11 is illustrated. An X-axis direction and a Y-axis direction correspond to a plane direction of a layer. The X-axis direction, the Y-axis direction, and an XY plane direction are also referred to as a horizontal direction. A Z-axis direction corresponds to a direction (lamination direction) perpendicular to the plane direction of the layer. The Z-axis direction is also referred to as a perpendicular direction.

A voltage that can be applied to (both ends of) the magnetoresistive element 11 is referred to as a voltage V in the drawing. A current that can be applied to the magnetoresistive element 11 is referred to as a current J in the drawing. The voltage V and the current J are controlled by the write circuit 24, the read circuit 25 (FIG. 1), and the like.

The magnetoresistive element 11 includes a fixed layer 111, a tunnel barrier layer 112, and a recording layer 113. In this example, the fixed layer 111, the tunnel barrier layer 112, and the recording layer 113 are laminated in this order in a Z-axis positive direction. Various known materials may be used as the material of each layer.

The fixed layer 111 is a magnetic layer whose magnetization direction is fixed, and is also referred to as a reference layer or the like. It is assumed that the magnetization of the fixed layer 111 is fixed in the Z-axis positive direction.

The tunnel barrier layer 112 is a nonmagnetic layer provided between the fixed layer 111 and the recording layer 113.

The recording layer 113 is a magnetic layer whose magnetization direction changes, and is also referred to as a free layer or the like. The magnetization of the recording layer 113 changes between the Z-axis positive direction and a Z-axis negative direction.

Note that the arrangement of the fixed layer 111 and the recording layer 113 may be opposite to that in the example illustrated in FIG. 2. In that case, the recording layer 113, the tunnel barrier layer 112, and the fixed layer 111 are laminated in this order in the Z-axis positive direction.

The memory cell 10 is configured such that the recording layer 113 is placed in a magnetic field (horizontal magnetic field) in the plane direction (XY plane direction) of the layer. In the example illustrated in FIG. 2, the magnetoresistive element 11 further includes a magnetic field generation layer 114. The magnetic field generation layer 114 generates the horizontal magnetic field. In this example, the magnetic field generation layer 114 is provided on the side opposite to the tunnel barrier layer 112 with the recording layer 113 interposed therebetween.

Note that the magnetic field generation layer 114 may be provided on the side opposite to the tunnel barrier layer 112 with the fixed layer 111 interposed therebetween. In addition, a method other than the magnetic field generation layer 114 may be used for generating the horizontal magnetic field. For example, a magnetic field may be generated by forming a magnet layer above (the Z-axis positive direction side) or below (the Z-axis negative direction side) the magnetoresistive element 11. A magnetic field may be generated by disposing a permanent magnet in the periphery.

In this example, the selection transistor 12 is a field effect transistor (FET). One of a drain and a source of the selection transistor 12 is connected to the magnetoresistive element 11. The other of the drain and the source of the selection transistor 12 is connected to the source line SL. A gate of the selection transistor 12 is connected to the word line WL. When a voltage signal from the word line WL is applied to the gate of the selection transistor 12 and the selection transistor 12 is turned on (the drain and the source are brought into a conductive state), the magnetoresistive element 11 is connected to the bit line BL and the source line SL, and the voltage V and the current J are applied to the magnetoresistive element 11.

Data is written into the memory cell 10 by switching the resistance value of the magnetoresistive element 11 between a low resistance value and a high resistance value. The resistance value of the magnetoresistive element 11 is referred to as a resistance value R. The low resistance value is referred to as a low resistance value $R_{Low}$. The high resistance value is referred to as a high resistance value $R_{High}$. Data corresponding to the low resistance value $R_{Low}$ is also referred to as "Low". Data corresponding to the high resistance value $R_{High}$ is also referred to as "High". For example, the data "Low" corresponds to "0", and the data "High" corresponds to "1".

By reversing the magnetization direction of the recording layer 113 of the magnetoresistive element 11 between the Z-axis positive direction and the Z-axis negative direction, the resistance value R of the magnetoresistive element 11 is switched between the low resistance value RLow and the high resistance value RHigh. The magnetoresistive element 11 is an MTJ element capable of reversing the magnetization of the recording layer 113 by using a VCMA effect. This will be described with reference to FIGS. 3A and 3B.

Figure 3A:
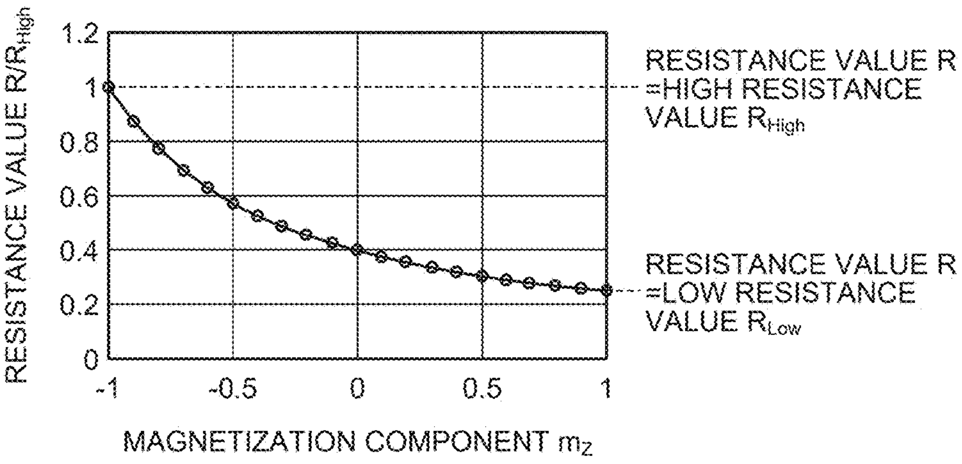
FIGS. 3A and 3B are diagrams illustrating an example of characteristics of a magnetoresistive element 11.
Figure 3B:
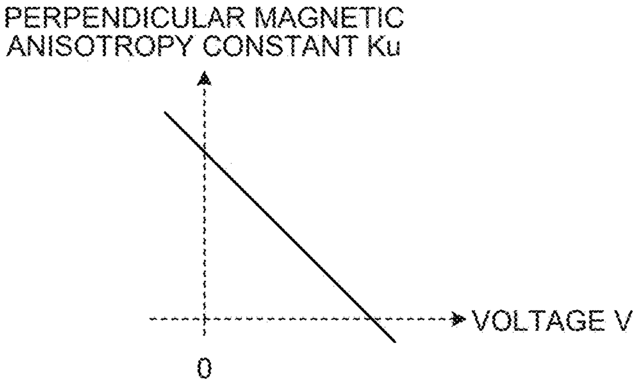

FIGS. 3A and 3B are diagrams illustrating an example of characteristics of the magnetoresistive element 11. FIG. 3A illustrates a relationship between a magnetization component mZ of the recording layer 113 and the resistance value R of the magnetoresistive element 11. The horizontal axis of the graph indicates the magnetization component mZ of the recording layer 113. The magnetization component mZ is the magnitude of magnetization of the recording layer 113 in the Z-axis direction. When the magnetization component mZ is 1, the magnetization direction of the recording layer 113 is the Z-axis positive direction. When the magnetization component mZ is −1, the magnetization direction of the recording layer 113 is the Z-axis negative direction. The vertical axis of the graph indicates the resistance value R of the magnetoresistive element 11 normalized by the high resistance value RHIGH.

When the magnetization of the recording layer 113 rotates, the magnetization component $m_z$ changes between −1 and 1. When the magnetization component $m_z$ is 1, the magnetization direction of the recording layer 113 is the Z-axis positive direction which is the same as the magnetization direction of the fixed layer 111, and the resistance value R of the memory cell array 1 becomes the low resistance value $R_{Low}$. Conversely, when the magnetization component $m_z$ is −1, the magnetization direction of the recording layer 113 is the Z-axis negative direction opposite to the magnetization direction of the fixed layer 111, and the resistance value R of the memory cell array 1 becomes the high resistance value $R_{High}$. The resistance value R of the magnetoresistive element 11 gradually changes between the low resistance value $R_{Low}$ and the high resistance value $R_{High}$ during the rotation of magnetization of the recording layer 113.

FIG. 3B illustrates an example of the voltage dependency of a perpendicular magnetic anisotropy constant Ku of the recording layer 113. The horizontal axis of the graph indicates the voltage V. The vertical axis of the graph indicates the perpendicular magnetic anisotropy constant Ku of the recording layer 113.

As the perpendicular magnetic anisotropy constant Ku is larger, the recording layer 113 is more easily magnetized in the perpendicular direction. More specifically, when the perpendicular magnetic anisotropy constant Ku is positive, the recording layer 113 is easily magnetized in the perpendicular direction (Z-axis direction). When the perpendicular magnetic anisotropy constant Ku is negative, the recording layer 113 is easily magnetized in the horizontal direction (XY plane direction).

As understood from the graph, when the voltage V is 0, that is, when the voltage V is not applied to the magnetoresistive element 11, the perpendicular magnetic anisotropy constant Ku is positive. The recording layer 113 at this time is easily magnetized in the perpendicular direction. When the voltage V is applied to the magnetoresistive element 11, the value of the perpendicular magnetic anisotropy constant Ku changes. Specifically, as the voltage V increases, the perpendicular magnetic anisotropy constant Ku decreases, and when the voltage V exceeds a certain voltage, the perpendicular magnetic anisotropy constant Ku becomes negative. The recording layer 113 at this time is easily magnetized in the horizontal direction.

As described above, when the voltage V at which the recording layer 113 is easily magnetized in the horizontal direction is applied to the magnetoresistive element 11, the magnetization of the recording layer 113 of the magnetoresistive element 11 rotates by precession around the horizontal magnetic field. By reversing the magnetization of the recording layer 113 using this rotation, the resistance value R of the magnetoresistive element 11 can be switched between the low resistance value $R_{Low}$ and the high resistance value $R_{High}$, and data can be written into the memory cell 10.

Conventionally, a voltage is pulsed so that a constant voltage at which the perpendicular magnetic anisotropy constant Ku is 0 is applied only during a magnetization reversal period (time required for half rotation) of the recording layer 113. However, since the magnetization reversal period of the recording layer 113 depends on the strength of the magnetic field in the horizontal direction and is a short period such as 0.7 ns, for example, highly accurate pulse control of about ±0.1 ns is required. Such pulse control is not easy, and control becomes more difficult when element variations are taken into consideration.

Returning to FIG. 1, the write circuit 24 reverses the magnetization of the recording layer 113 so that the resistance value R of the magnetoresistive element 11 is switched between the low resistance value $R_{Low}$ and the high resistance value $R_{High}$. In the example illustrated in FIG. 1, the write circuit 24 includes a current limiting circuit 241. The current limiting circuit 241 limits the current J applied to the magnetoresistive element 11. The current limiting circuit 241 limits the current J so as to have a predetermined magnitude regardless of the magnitude of the resistance value R of the magnetoresistive element 11. The phrase "limits the current J so as to have a predetermined magnitude" may be understood to include applying the current J smaller than the current J having the predetermined magnitude in a case where the resistance value R of the magnetoresistive element 11 is too high to apply the current J having the predetermined magnitude.

The write circuit 24 reverses the magnetization of the recording layer 113 so that the resistance value R of the magnetoresistive element 11 is switched from the high resistance value $R_{High}$ to the low resistance value $R_{Low}$ by applying the current J limited so as to have the predetermined magnitude by the current limiting circuit 241 to the magnetoresistive element 11. When the current J is applied to the magnetoresistive element 11, the voltage V (=RJ) based on the resistance value R and the current J is applied to the magnetoresistive element 11. The magnetization of the recording layer 113 of the magnetoresistive element 11 rotates on the above-described principle. During the rotation, the resistance value R of the magnetoresistive element 11 gradually decreases, and the voltage V (=RJ) also decreases. When the voltage V decreases, the perpendicular magnetic anisotropy constant Ku of the recording layer 113 increases, and the perpendicular magnetic anisotropy returns. At the timing when the magnetization of the recording layer 113 is reversed, the resistance value R of the magnetoresistive element 11 becomes the minimum low resistance value $R_{Low}$, and the perpendicular magnetic anisotropy constant Ku increases. The magnetization of the recording layer 113 stops precession and stops (automatically) at the reversed timing. The resistance value R of the magnetoresistive element 11 is switched from the high resistance value $R_{High}$ to the low resistance value $R_{Low}$, and the data "Low" is written into the memory cell 10.

Figure 4:
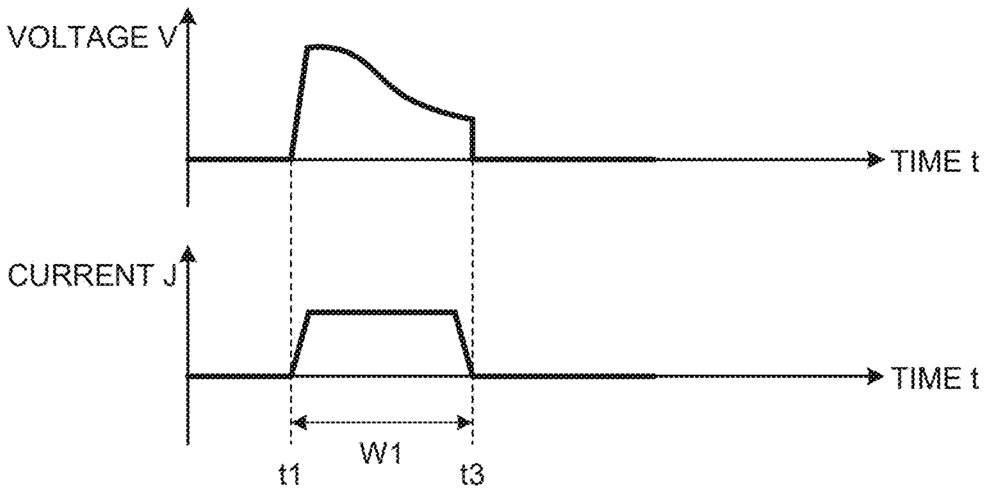
FIG. 4 is a diagram schematically illustrating writing of data into the memory cell 10.

FIG. 4 is a diagram schematically illustrating writing of data into the memory cell 10. The voltage V and the current J with respect to time t are illustrated. It is assumed that the resistance value R of the magnetoresistive element 11 is initially the high resistance value $R_{High}$.

The data "Low" is written from time t1 to time t3. The write circuit 24 applies the current J limited by the current limiting circuit 241 to the magnetoresistive element 11. The voltage V (=RJ) is applied to the magnetoresistive element 11. The resistance value R of the magnetoresistive element 11 gradually decreases, and the voltage V also gradually decreases. The rotation of magnetization of the recording layer 113 stops at the timing when the magnetization of the recording layer 113 is reversed, that is, the resistance value R becomes the low resistance value $R_{Low}$. The resistance value R of the magnetoresistive element 11 becomes the low resistance value $R_{Low}$.

The pulse width of the current J is referred to as a pulse width W1 in the drawing. As described above, since the rotation of magnetization of the recording layer 113 automatically stops at the reversal timing, the pulse width W1 of the current J may be longer than the magnetization reversal period. Accordingly, pulse control is facilitated. This will be described also by using a comparative example.

Figure 5:
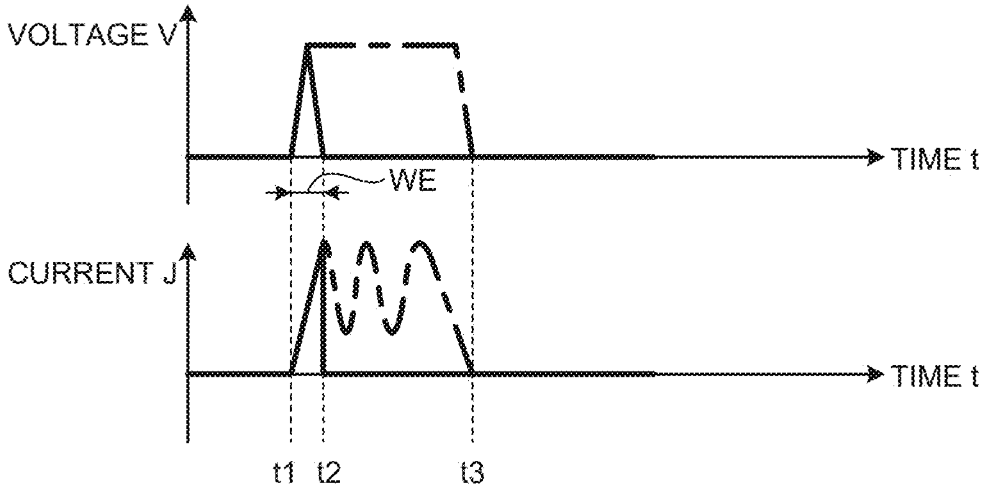
FIG. 5 is a diagram schematically illustrating writing of data according to a comparative example.

FIG. 5 is a diagram schematically illustrating writing of data according to a comparative example. In the comparative example, a constant voltage V having a pulse width WE which is the same as the magnetization reversal period of the recording layer 113 is applied to the magnetoresistive element 11 from time t1 to time t2. The magnetization of the recording layer 113 is reversed, and during that time, the resistance value R of the magnetoresistive element 11 decreases and the current J (=V/R) increases. The resistance value R of the magnetoresistive element 11 becomes the low resistance value $R_{Low}$.

The pulse width WE of the voltage V in this comparative example is shorter than the pulse width W1 of the current J in FIG. 4 described above. Accordingly, the pulse control becomes difficult. Note that as virtually indicated by alternate long and short dash lines in FIG. 5, if the pulse width of the voltage V becomes longer than the pulse width WE, the magnetization of the recording layer 113 continues to rotate during that time, and the resistance value R and the current J repeat vibration. Unlike FIG. 4 described above, the magnetization of the recording layer 113 does not automatically stop at the reversed timing. Therefore, in the comparative example, the pulse width WE of the voltage V cannot be increased.

As described above, in the first embodiment, the resistance value R of the magnetoresistive element 11 can be switched from the high resistance value $R_{High}$ to the low resistance value $R_{Low}$ by applying the current J limited so as to have the predetermined magnitude to the magnetoresistive element 11. The pulse width W1 of the current J may be longer than the magnetization reversal period of the recording layer 113. Therefore, pulse control for reversing the magnetization of the recording layer 113 is facilitated. For example, since highly accurate pulse control becomes unnecessary, circuit design is facilitated. In addition, it is possible to suppress deterioration of a success probability of a reversal (reversal probability) of magnetization of the recording layer 113 due to a pulse width and variations in elements.

In one embodiment, the write circuit 24 may apply the current J that is limited in stages so as to have different predetermined magnitudes to the magnetoresistive element 11 during a reversal of magnetization of the magnetoresistive element 11. This will be described with reference to FIG. 6.

Figure 6:
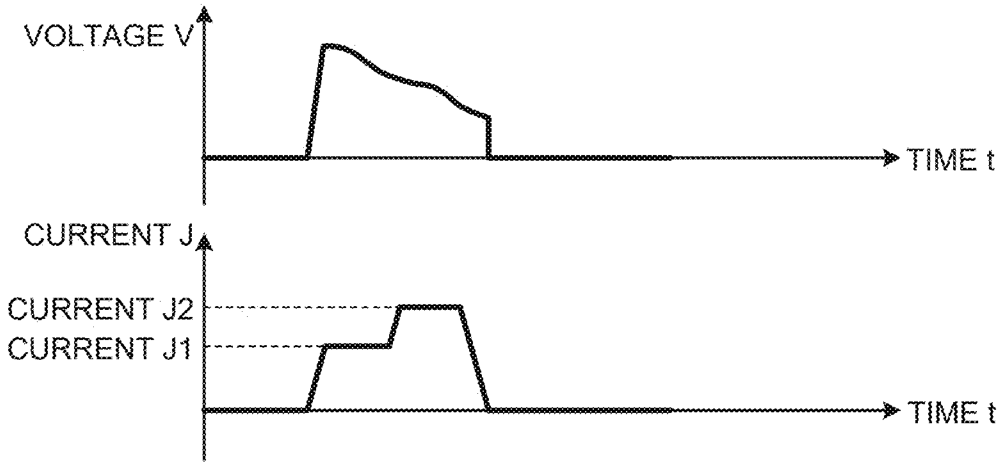
FIG. 6 is a diagram schematically illustrating a current J limited in stages.

FIG. 6 is a diagram schematically illustrating the current J limited in stages. In this example, the current J is limited in two stages of a current J1 and a current J2. Initially, the current J is limited to the current J1. Thereafter, the current J is limited to the current J2 larger than the current J1. Of course, it is also possible to limit the current J in three or more stages.

Writing of data will be further described. In the first embodiment, writing of data into the memory cell 10 includes initial reading and verification reading. This will be described with reference to FIGS. 7A and 7B.

Figure 7A:
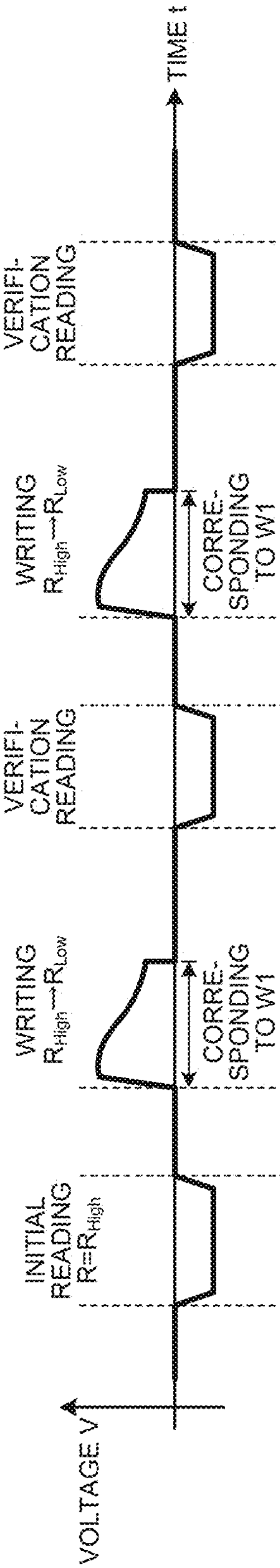
FIGS. 7A and 7B are diagrams schematically illustrating writing of data into the memory cell 10 in the first embodiment.
Figure 7B:
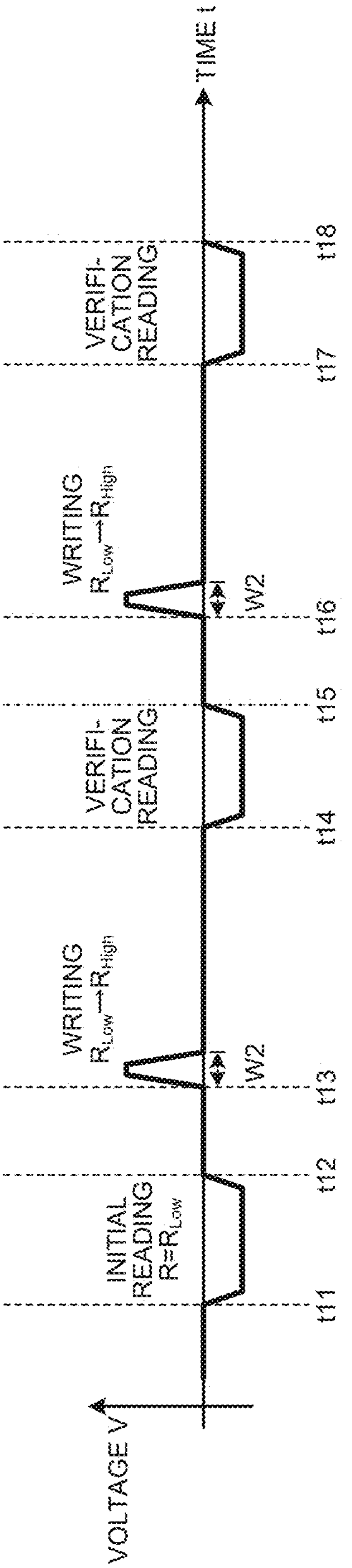

FIGS. 7A and 7B are diagrams schematically illustrating writing of data into the memory cell 10 in the first embodiment. FIG. 7A illustrates a change in the voltage V when the resistance value R of the magnetoresistive element 11 is switched from the high resistance value RHigh to the low resistance value RLow. FIG. 7B illustrates a change in the voltage V when the resistance value R of the magnetoresistive element 11 is switched from the low resistance value RLow to the high resistance value RHigh.

From time t11 to time t12, initial reading of data is performed. The read circuit 25 detects the resistance value R of the magnetoresistive element 11 by applying a low voltage at which the magnetization of the recording layer 113 is not reversed to the magnetoresistive element 11. In FIG. 7A, the high resistance value RHigh is detected. In FIG. 7B, the low resistance value RLow is detected.

At time t13, data is written. The write circuit 24 reverses the magnetization of the recording layer 113 so that the resistance value R of the magnetoresistive element 11 is switched between the low resistance value RLow and the high resistance value RHigh. In FIG. 7A, the write circuit 24 applies the current J (pulse width W1) limited by the current limiting circuit 241 to the magnetoresistive element 11 whose resistance value R is detected to be the high resistance value RHigh by the read circuit 25. The resistance value R of the magnetoresistive element 11 is switched from the high resistance value RHigh to the low resistance value RLow, and the data "Low" is written. In FIG. 7B, the write circuit 24 applies the constant voltage V (pulse width W2) to the magnetoresistive element 11 whose resistance value R is detected to be the low resistance value RLow by the read circuit 25. The pulse width W2 of the voltage V may be the same as the magnetization reversal period of the recording layer 113, for example, similarly to the pulse width WE described above with reference to FIG. 5. The resistance value R of the magnetoresistive element 11 is switched from the low resistance value RLow to the high resistance value RHigh, and the data "High" is written.

From time t14 to time t15, verification reading is performed. In order to determine whether or not the switching of the resistance value R of the magnetoresistive element 11 by the write circuit 24 is successful, the read circuit 25 detects the resistance value R of the magnetoresistive element 11 by applying a voltage at which the magnetization of the recording layer 113 is not reversed to the magnetoresistive element 11. A recording state of the memory cell 10, that is, whether the resistance value R has been correctly switched is checked. Here, it is assumed that the writing of data at the previous time t13 has failed and the same resistance value R as that of the initial reading has been detected. Therefore, the data is written again.

At time t16, the data is written. Details are similar to the writing of data at the previous time t13, and thus, the description will not be repeated.

From time t17 to time t18, verification reading is performed. Here, it is assumed that the writing of data at the previous time t16 has succeeded. Therefore, the writing of data ends.

Figure 8A:
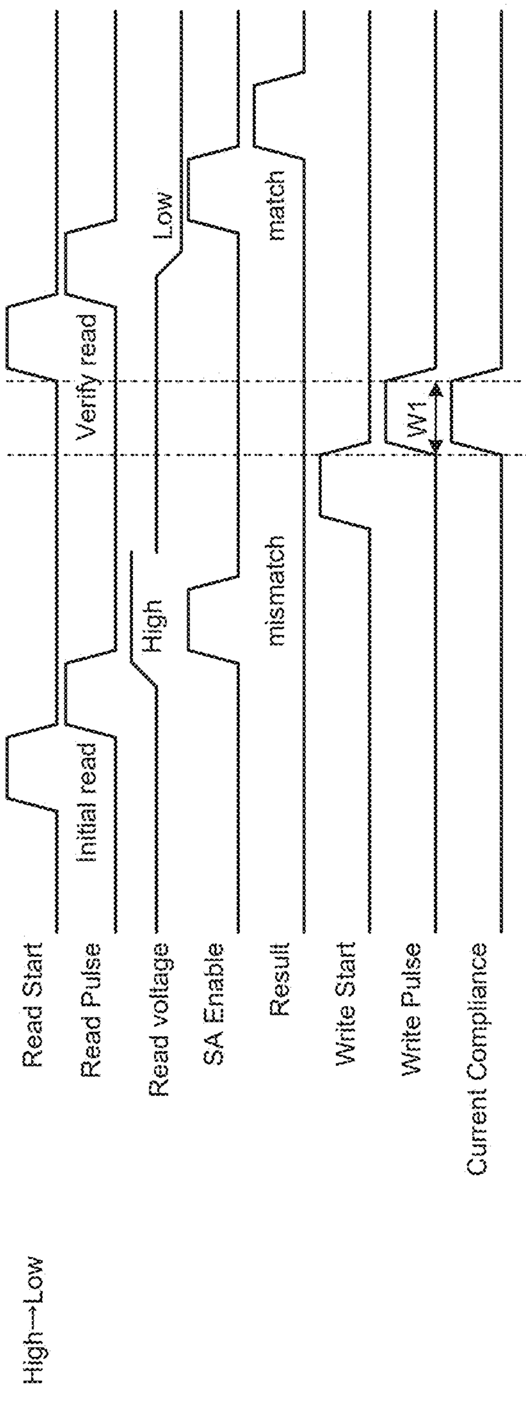
FIGS. 8A and 8B are diagrams illustrating an example of control of writing data into the memory cell 10 in the first embodiment.
Figure 8B:
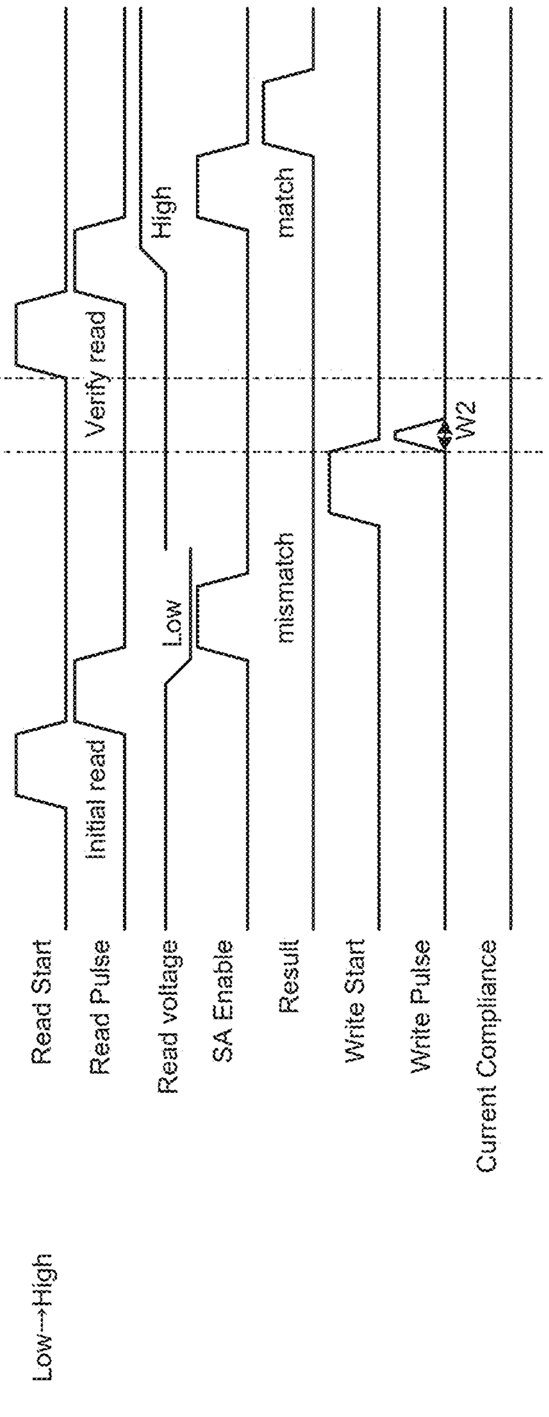

FIGS. 8A and 8B are diagrams illustrating an example of control of writing data into the memory cell 10 in the first embodiment. In FIG. 8A, the data of the memory cell 10 is rewritten from "High" to "Low". In FIG. 8B, the data of the memory cell 10 is rewritten from "Low" to "High".

Initial reading (Initial read) is performed. The control circuit 22 transmits a read start signal (Read Start) to the read circuit 25. The read circuit 25 issues a read pulse (Read Pulse). The read pulse is supplied, via the bit line control circuit 27, to the bit line BL connected to the memory cell 10 into which data is written.

A read voltage (Read voltage) from the magnetoresistive element 11 to be accessed is input to the sense amplifier 30. The control circuit 22 enables the sense amplifier 30 (SA Enable). Since the potential changes according to the state of the resistance value R of the magnetoresistive element 11 (the recording state of the memory cell 10), the sense amplifier 30 detects the read voltage (High or Low) at the time when the potential is determined. This detection corresponds to detection of the resistance value R (high resistance value $R_{High}$ or low resistance value $R_{Low}$) of the magnetoresistive element 11, and thus, the data of the memory cell 10 is read.

The control circuit 22 compares the data of the memory cell 10 read by the sense amplifier 30 with the data to be written. Here, the comparison result is a mismatch (Result, mismatch), and the control circuit 22 transmits a write start signal (Write Start) to the write circuit 24.

The write circuit 24 issues a write pulse (Write Pulse). The write pulse is supplied, via the bit line control circuit 27, to the bit line BL connected to the memory cell 10 into which data is written. In FIG. 8A, the current J is limited (Current Compliance) by the current limiting circuit 241 of the write circuit 24. The write circuit 24 applies the limited current J (pulse width W1) to the magnetoresistive element 11. The resistance value R of the magnetoresistive element 11 is switched from the high resistance value RHigh to the low resistance value RLow, and the data "High" is written. In FIG. 8B, the current J is not limited by the current limiting circuit 241 of the write circuit 24. The write circuit 24 applies the constant voltage V (pulse width W2) to the magnetoresistive element 11. The resistance value R of the magnetoresistive element 11 is switched from the low resistance value RLow to the high resistance value RHigh, and the data "Low" is written.

Thereafter, verification reading (Verify read) is performed. The control circuit 22 compares the data of the memory cell 10 read by the verification reading with the data to be written. Here, the comparison result is a match (Result, match), and thus, the writing of data ends.

Figure 9:
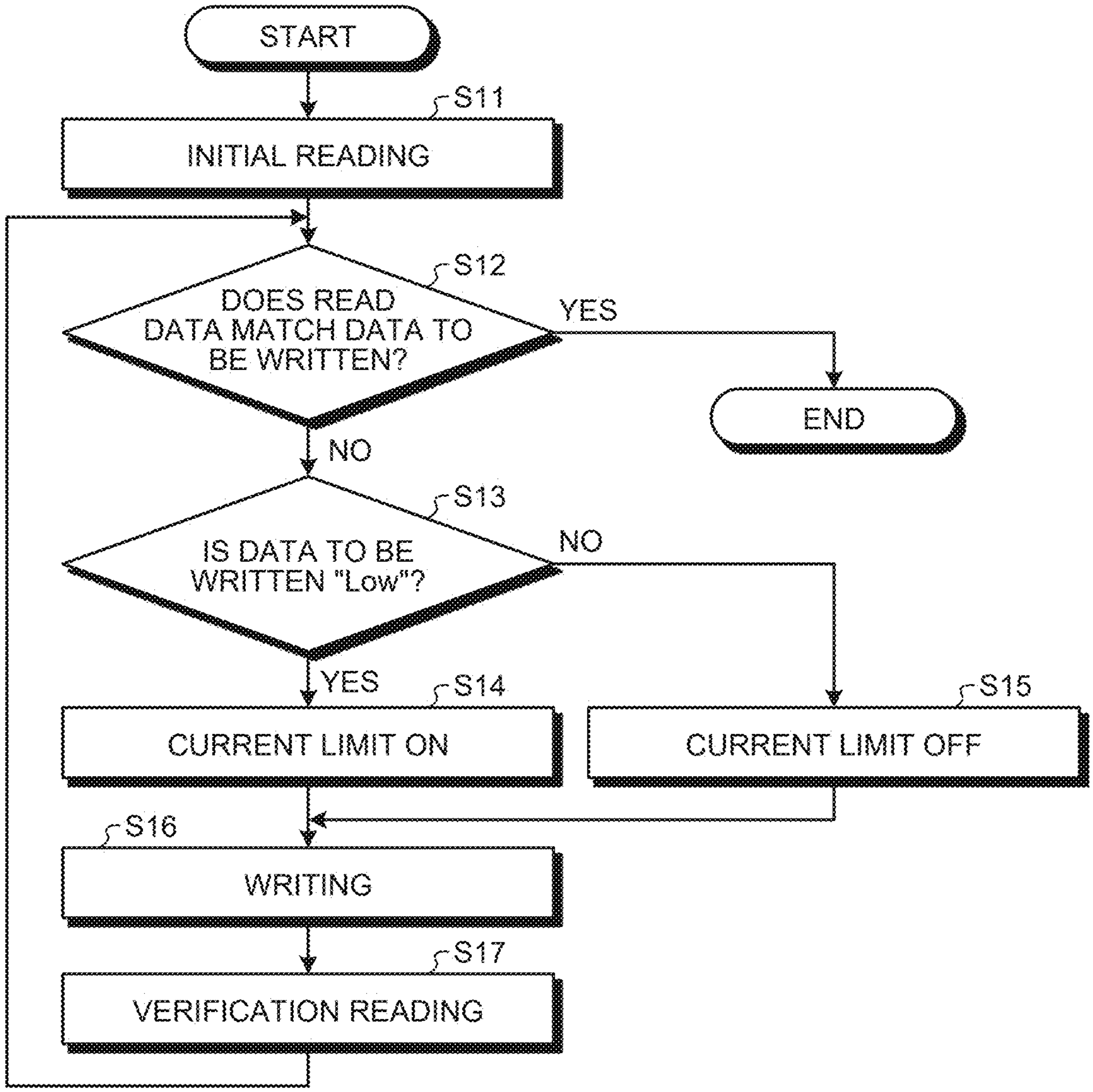
FIG. 9 is a flowchart illustrating an example of processing executed in the magnetoresistive effect memory 100 according to the first embodiment.

FIG. 9 is a flowchart illustrating an example of processing executed in the magnetoresistive effect memory 100 in the first embodiment. This flow is controlled, for example, by a state machine in the control circuit 22 (FIG. 1). The processing of the flowchart starts in response to input of a write command and data to be written via the I/O 21.

In Step S11, initial reading is performed. The resistance value R of the magnetoresistive element 11 of the memory cell 10 into which data is written is detected, and data of the memory cell 10 is read.

In Step S12, it is determined whether or not the read data matches the data to be written. When they match each other (Step S12: Yes), the processing of the flowchart ends. Otherwise (Step S12: No), the processing proceeds to Step S13.

In Step S13, it is determined whether or not the data to be written is "Low". If the data to be written is "Low" (Step S13: Yes), the processing proceeds to Step S14. Otherwise (Step S13: No), the processing proceeds to Step S15.

In Step S14, current limit is turned on. The function of limiting the current J by the current limiting circuit 241 of the write circuit 24 is enabled. Thereafter, the processing proceeds to Step S16.

In step 15, the current limit is turned off. The function of limiting the current J by the current limiting circuit 241 of the write circuit 24 is not enabled (disabled). Thereafter, the processing proceeds to Step S16.

In Step S16, data is written. When the data to be written is "Low", the current J (pulse width W1) limited by the current limiting circuit 241 is applied to the magnetoresistive element 11. The resistance value R of the magnetoresistive element 11 is switched from the high resistance value $R_{High}$ to the low resistance value $R_{Low}$, and the data "Low" is written. When the data to be written is "High", the constant voltage V (pulse width W2) is applied to the magnetoresistive element 11. The resistance value R of the magnetoresistive element 11 is switched from the low resistance value $R_{Low}$ to the high resistance value $R_{High}$, and the data "High" is written.

In Step S17, verification reading is performed. Thereafter, the processing returns to Step S12. When the read data matches the data to be written (Step S12: Yes), the processing of the flowchart ends. Otherwise (Step S12: No), the processing proceeds to Step S13.

For example, as described above, data is written into the memory cell 10. Note that an upper limit (maximum number) may be set to the number of times of verification reading and rewriting, that is, the number of times of loops in Steps S12 to S17 after Step S17.

2. Second Embodiment

Figure 10:
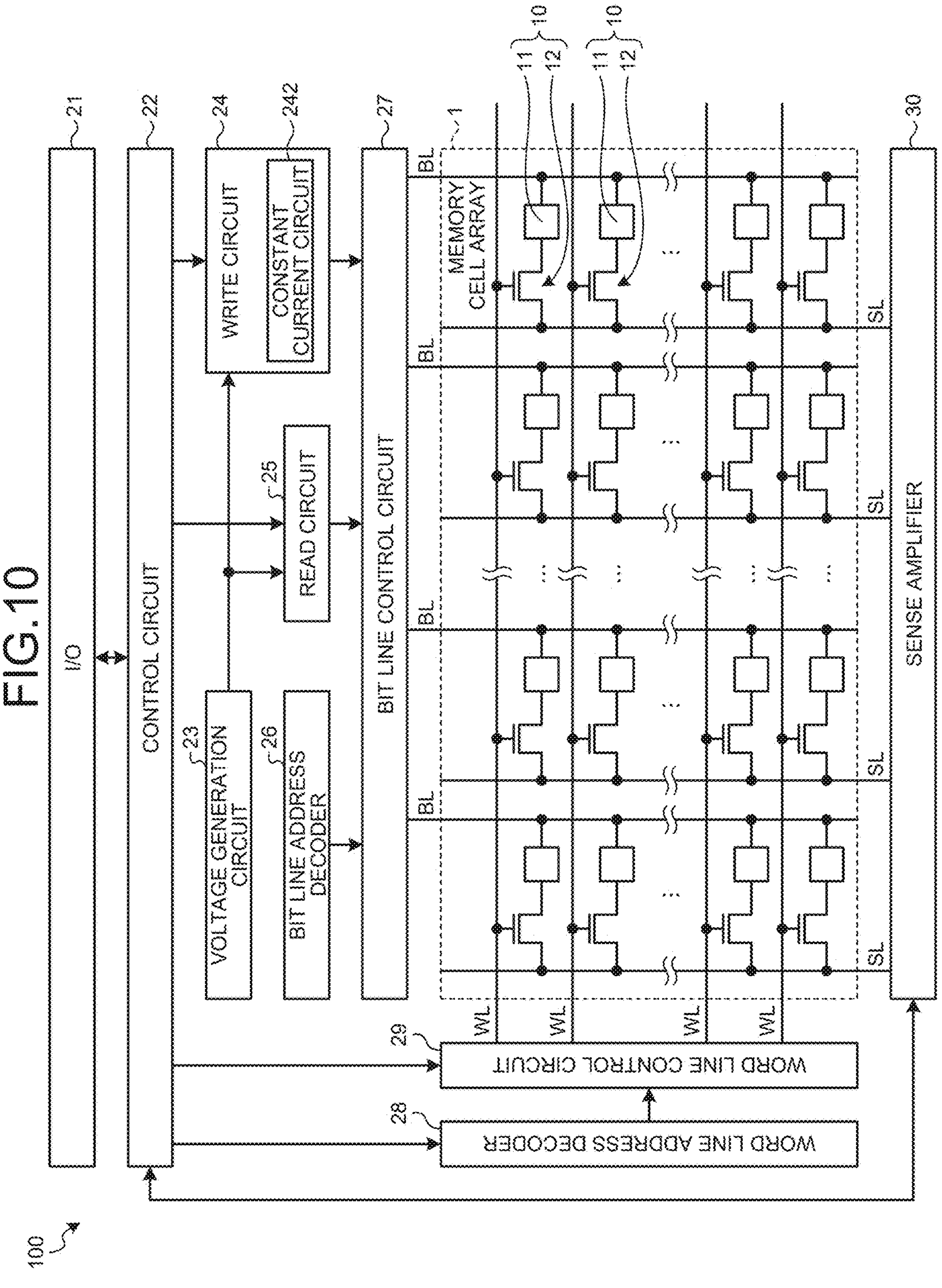
FIG. 10 is a diagram illustrating an example of a schematic configuration of a magnetoresistive effect memory 100 according to a second embodiment.

FIG. 10 is a diagram illustrating an example of a schematic configuration of a magnetoresistive effect memory 100 according to a second embodiment. The magnetoresistive effect memory 100 of the second embodiment is different from that of the first embodiment (FIG. 1) in that a write circuit 24 includes a constant current circuit 242. The constant current circuit 242 makes a current J applied to a magnetoresistive element 11 constant (makes a current constant). In other words, the limited current J in the first embodiment described above is a constant current in the second embodiment.

Note that when the current J is a constant current, a large voltage V is applied to the magnetoresistive element 11 at the start of switching from a high resistance value $R_{High}$ to a low resistance value $R_{Low}$, and a perpendicular magnetic anisotropy constant Ku may become temporarily negative. However, even in that case, since the perpendicular magnetic anisotropy constant Ku increases as a resistance value R decreases, the resistance value R of the magnetoresistive element 11 can be switched from the high resistance value $R_{High}$ to the low resistance value $R_{Low}$ on the same operation principle as in the first embodiment. Therefore, pulse control for reversing the magnetization of the recording layer 113 is facilitated.

Figure 11:
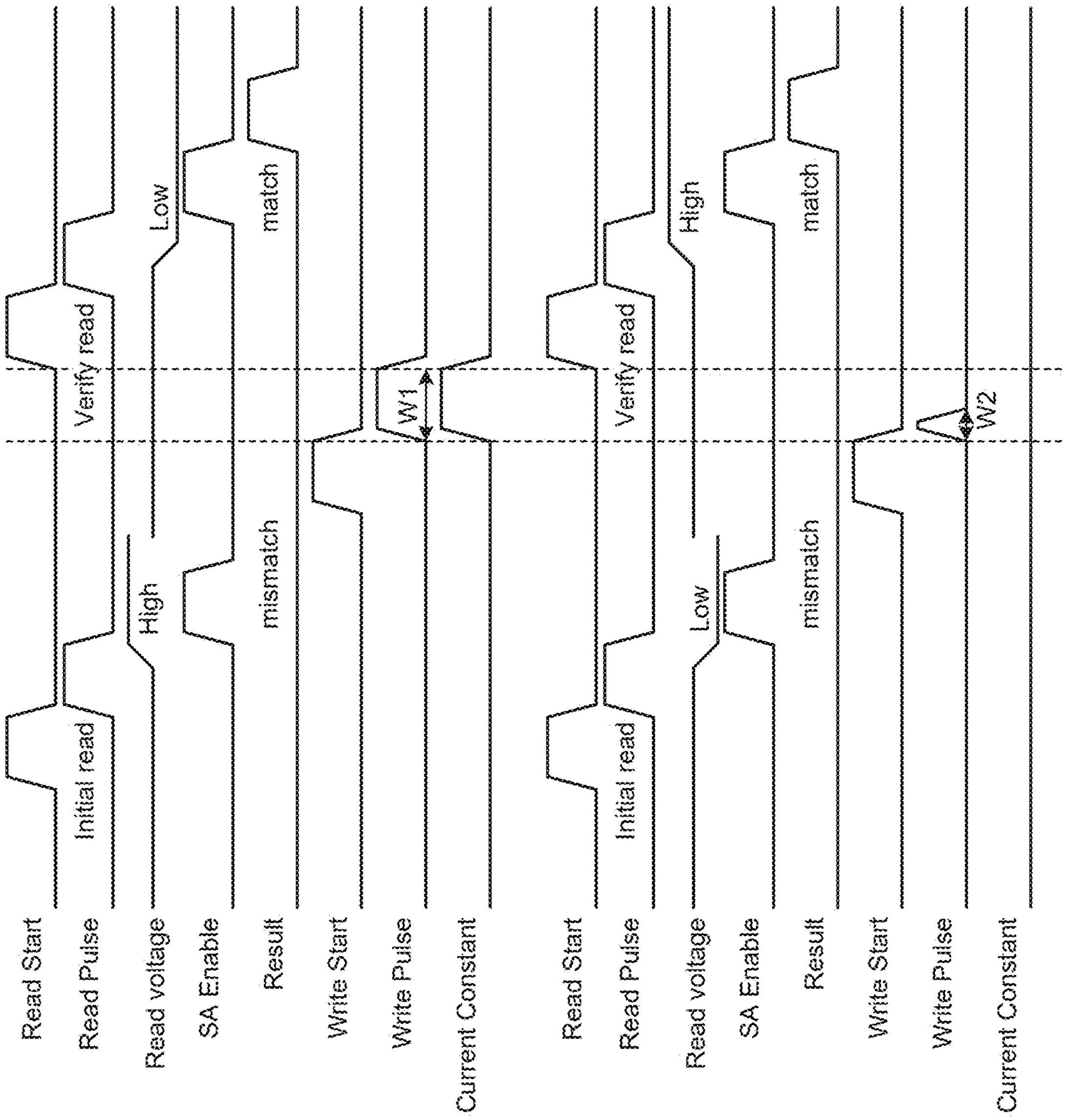
FIGS. 11A and 11B are diagrams illustrating an example of control of writing data into a memory cell 10 in the second embodiment.

FIGS. 11A and 11B are diagrams illustrating an example of control of writing data into a memory cell 10 in the second embodiment. The present embodiment is different from the first embodiment (FIGS. 8A and 8B) in that a current is made constant (Current Constant) by the constant current circuit 242 instead of the current limit (Current Compliance) by the current limiting circuit 241. Other control is the same as that of the first embodiment, and thus, the description will not be repeated.

Figure 12:
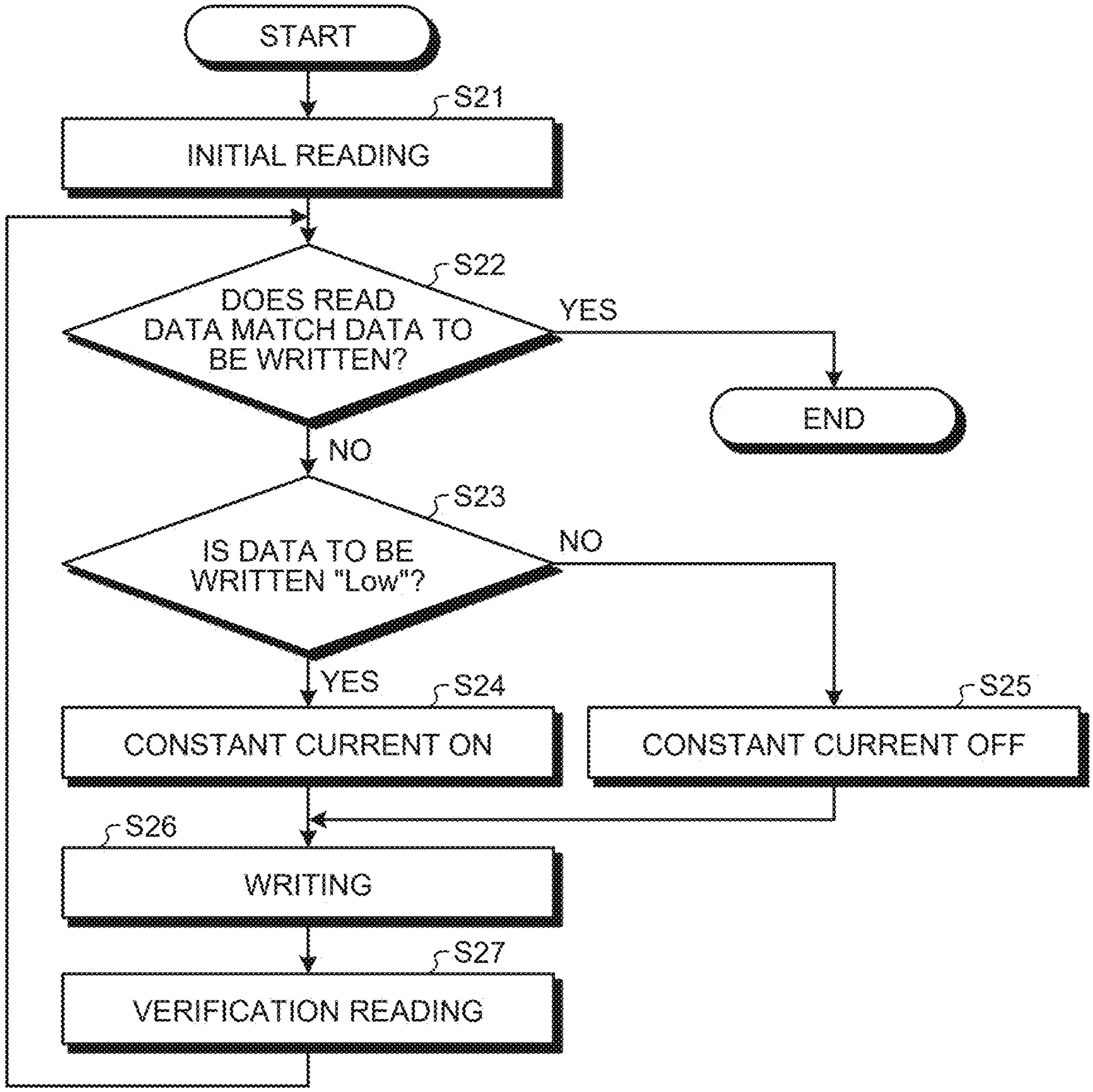
FIG. 12 is a flowchart illustrating an example of processing executed in the magnetoresistive effect memory 100 of the second embodiment.

FIG. 12 is a flowchart illustrating an example of processing executed in the magnetoresistive effect memory 100 of the second embodiment. Since the processing of Steps S21 to S23 and S27 is similar to the processing of Steps S11 to S13 and S17 of the first embodiment (FIG. 9), the description will not be repeated.

In Step S24, the constant current is turned on. The function of making the current J constant by the constant current circuit 242 of the write circuit 24 is enabled. Thereafter, the processing proceeds to Step S26.

In Step S25, the constant current is turned off. The function of making the current J constant by the constant current circuit 242 of the write circuit 24 is not enabled (disabled). Thereafter, the processing proceeds to Step S26.

In Step S26, data is written. When the data to be written is "Low", the current J (pulse width W1) made constant by the constant current circuit 242 is applied to the magnetoresistive element 11. The resistance value R of the magnetoresistive element 11 is switched from the high resistance value $R_{High}$ to the low resistance value $R_{Low}$, and the data "Low" is written. When the data to be written is "High", the constant voltage V (pulse width W2) is applied to the magnetoresistive element 11. The resistance value R of the magnetoresistive element 11 is switched from the low resistance value $R_{Low}$ to the high resistance value $R_{High}$, and the data "High" is written.

3. Third Embodiment

In a third embodiment, writing data into a memory cell 10 includes initialization instead of initial reading. By performing the initialization, the initial reading becomes unnecessary. A basic configuration of a magnetoresistive effect memory 100 is similar to that of the first embodiment (FIG. 1) or the second embodiment (FIG. 10). Unless otherwise specified, the third and subsequent embodiments will be described assuming the configuration of FIG. 10.

A write circuit 24 initializes a resistance value R of a magnetoresistive element 11 to a low resistance value $R_{Low}$ by applying a current J made constant by a constant current circuit 242 to the magnetoresistive element 11. The resistance value R of the magnetoresistive element 11 having a high resistance value $R_{High}$ before initialization is switched from the high resistance value $R_{High}$ to the low resistance value $R_{Low}$. The resistance value R of the magnetoresistive element 11 having the low resistance value $R_{Low}$ before initialization remains at the low resistance value $R_{Low}$ because the voltage V is low and precession does not occur even when the current J is applied.

Figures 13A, 13B, 13C, 13D:
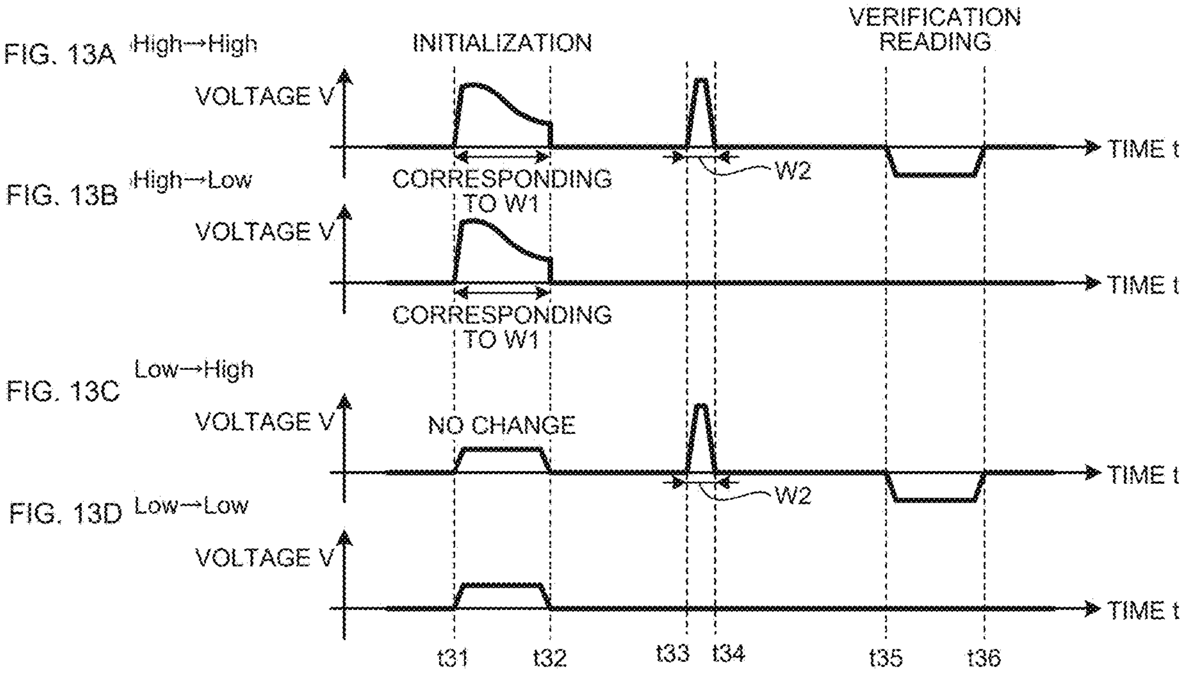
FIGS. 13A, 13B, 13C, and 13D are diagrams schematically illustrating writing of data into a memory cell 10 in a third embodiment.

FIGS. 13A, 13B, 13C, and 13D are diagrams schematically illustrating writing of data into the memory cell 10 in the third embodiment. In FIG. 13A, data before initialization is "High", and data to be written is also "High". In FIG. 13B, data before initialization is "High", and data to be written is "Low". In FIG. 13C, data before initialization is "Low", and data to be written is "High". In FIG. 13D, data before initialization is "Low", and data to be written is also "Low".

Initialization is performed from time t31 to time t32. The write circuit 24 initializes the resistance value R of the magnetoresistive element 11 to the low resistance value RLow by applying the current J made constant by the constant current circuit 242 to the magnetoresistive element 11. In FIGS. 13A and 13B, the resistance value R of the magnetoresistive element 11 is switched from the high resistance value RHigh to the low resistance value RLow. In FIGS. 13C and 13D, the resistance value R of the magnetoresistive element 11 remains at the high resistance value RHigh (no change).

From time t33 to time t34, data is written as necessary. In FIGS. 13A and 13C, the data "High" is written. A constant voltage V (pulse width W2) is applied to the magnetoresistive element 11, and the resistance value R of the magnetoresistive element 11 is switched from the low resistance value RLow to the high resistance value RHigh. In FIGS. 13B and 13D, data is not written.

From time t35 to time t36, verification reading is performed as necessary. In FIGS. 13A and 13C, verification reading is performed according to the data writing at the previous time t33 to time t34. Here, it is assumed that data is successfully written. Therefore, the writing of data ends. In FIGS. 13B and 13D, verification reading is omitted, and the writing of data ends. However, verification reading may also be performed in FIGS. 13B and 13D.

FIGS. 14A, and 14B are diagrams illustrating an example of control of writing data into the memory cell 10 in the third embodiment. In FIG. 14A, the data "Low" is written. In FIG. 14B, the data "High" is written.

Initialization (Initialize) is performed. The write circuit 24 issues a write pulse (Write Pulse). The write pulse is supplied, via a bit line control circuit 27, to a bit line BL connected to the memory cell 10 into which data is written. The constant current circuit 242 of the write circuit 24 makes the current J constant (Current Constant). The write circuit 24 applies the current J (pulse width W1) made constant by the constant current circuit 242 to the magnetoresistive element 11. The resistance value R of the magnetoresistive element 11 is initialized to the low resistance value $R_{Low}$.

In FIG. 14A, since the data "Low" is written by the above initialization, the writing of data ends. Note that verification reading may be performed.

In FIG. 14B, the data "High" is written. The write circuit 24 issues a write pulse (Write Pulse). The write circuit 24 applies the constant voltage V (pulse width W2) to the magnetoresistive element 11. The resistance value R of the magnetoresistive element 11 is switched from the low resistance value RLow to the high resistance value RHigh. Thereafter, verification reading (Verify read) is performed. Here, the comparison result is a mismatch (Result, mismatch), and thus, data is written again. In the subsequent verification reading, the comparison result is matched (Result, match), and the writing of data ends.

Figure 15:
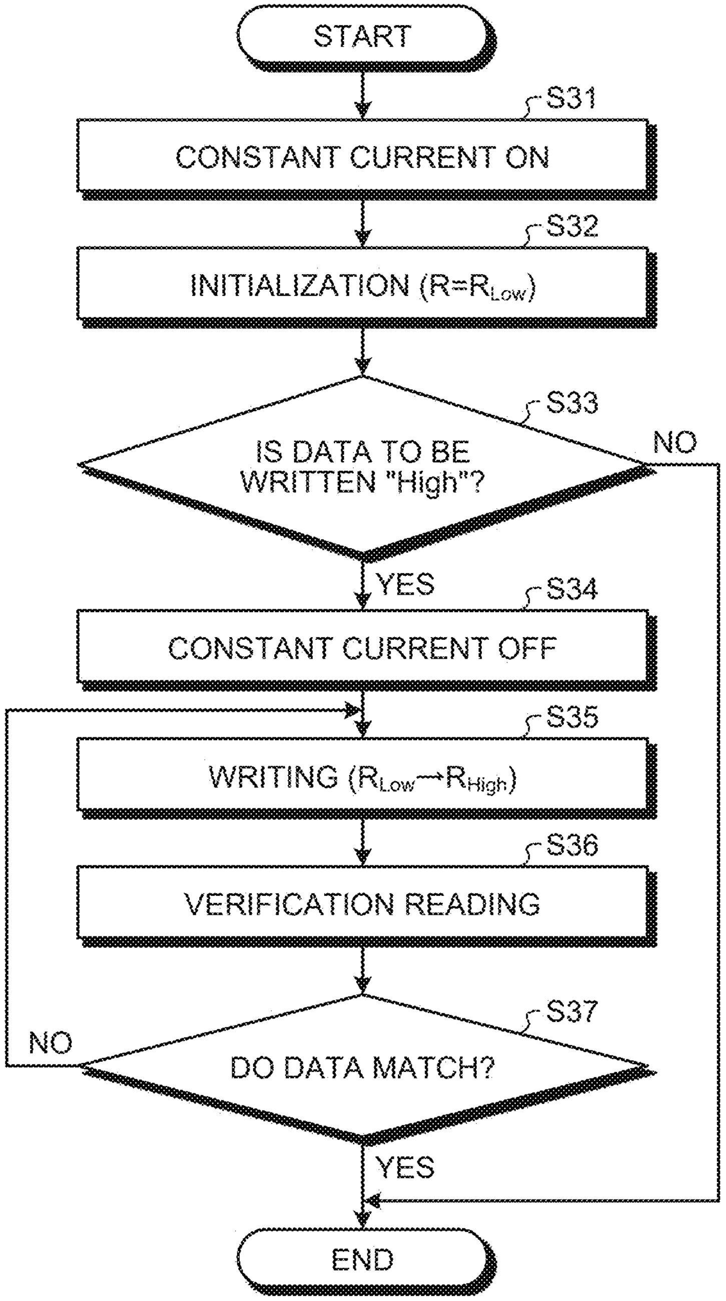
FIG. 15 is a flowchart illustrating an example of processing executed in a magnetoresistive effect memory 100 according to the third embodiment.

FIG. 15 is a flowchart illustrating an example of processing executed in the magnetoresistive effect memory 100 according to the third embodiment.

In Step S31, the constant current is turned on. The function of making the current J constant by the constant current circuit 242 is enabled.

In step S32, initialization is performed. The current J (pulse width W1) made constant is applied to all the magnetoresistive elements 11 (all bits) of the specified address. The resistance value R of the magnetoresistive element 11 is initialized to the low resistance value $R_{Low}$.

In Step S33, it is determined whether or not data to be written is "High". When the data to be written is "High" (Step S33: Yes), the processing proceeds to Step S34. Otherwise (Step S33: No), the processing of the flowchart ends.

In Step S34, the constant current is turned off. The function of making the current J constant by the current limiting circuit 241 is not enabled (disabled).

In Step S35, the data is written. The constant voltage V (pulse width W2) is applied to the magnetoresistive element 11, and the resistance value R of the magnetoresistive element 11 is switched from the low resistance value $R_{Low}$ to the high resistance value $R_{High}$.

In Step S36, verification reading is performed.

In Step S37, it is determined whether or not the read data matches the data to be written. When they match each other (Step S37: Yes), the processing of the flowchart ends. Otherwise (Step S27: No), the processing returns to Step S35, and the data is written again.

4. Fourth Embodiment

In a fourth embodiment, a resistance value R of a magnetoresistive element 11 is initialized to a high resistance value $R_{High}$using the technique of Non Patent Literature 1. According to the technique of Non Patent Literature 1, pulse control of a voltage V when the resistance value R of the magnetoresistive element 11 is switched from a low resistance value $R_{Low}$ to the high resistance value $R_{High}$ is facilitated. The effect of facilitating the pulse control for reversing the magnetization of a recording layer 113 is further enhanced.

Specifically, not only a magnetic field in the horizontal direction but also a magnetic field in the perpendicular direction is used. A change in magnetic field energy with respect to a magnetization component $m_z$ (−1 to 1) of the recording layer 113 has asymmetry due to the magnetic field in the perpendicular direction. By designing such that the magnetic field energy is minimized in a range where the magnetization component $m_z$ is negative (−1 ≤magnetization component $m_z$<0), that is, at a position where the magnetization of the recording layer 113 is close to the Z-axis negative direction, it is possible to suppress vibration of the magnetization direction and to reverse the magnetization in the Z-axis negative direction. The resistance value R of the magnetoresistive element 11 can be set to the high resistance value $R_{High}$ without controlling the pulse width of the voltage V with high accuracy.

Figure 16:
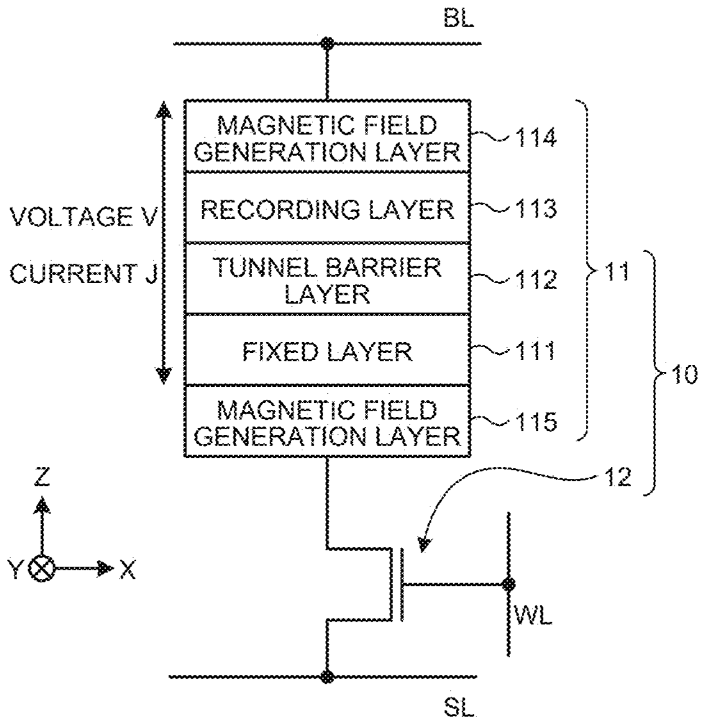
FIG. 16 is a diagram illustrating an example of a schematic configuration of a magnetoresistive element 11 of a magnetoresistive effect memory 100 according to a fourth embodiment.

FIG. 16 is a diagram illustrating an example of a schematic configuration of the magnetoresistive element 11 of a magnetoresistive effect memory 100 according to the fourth embodiment. A memory cell 10 is configured such that the recording layer 113 is also placed in the magnetic field (perpendicular magnetic field) in the perpendicular direction (Z-axis direction). In the example illustrated in FIG. 16, the magnetoresistive element 11 further includes a magnetic field generation layer 115. The magnetic field generation layer 115 generates the perpendicular magnetic field. In this example, the magnetic field generation layer 115 is provided on the side opposite to a tunnel barrier layer 112 with a fixed layer 111 interposed therebetween.

Note that the magnetic field generation layer 115 may be provided on the side opposite to the tunnel barrier layer 112 with the recording layer 113 interposed therebetween. A method other than the magnetic field generation layer 115 may be used for generating the perpendicular magnetic field. For example, a magnetic field may be generated by forming a magnet layer above (the Z-axis positive direction side) or below (the Z-axis negative direction side) the magnetoresistive element 11. A magnetic field may be generated by disposing a permanent magnet in the periphery.

Figures 17A, 17B, 17C, 17D:
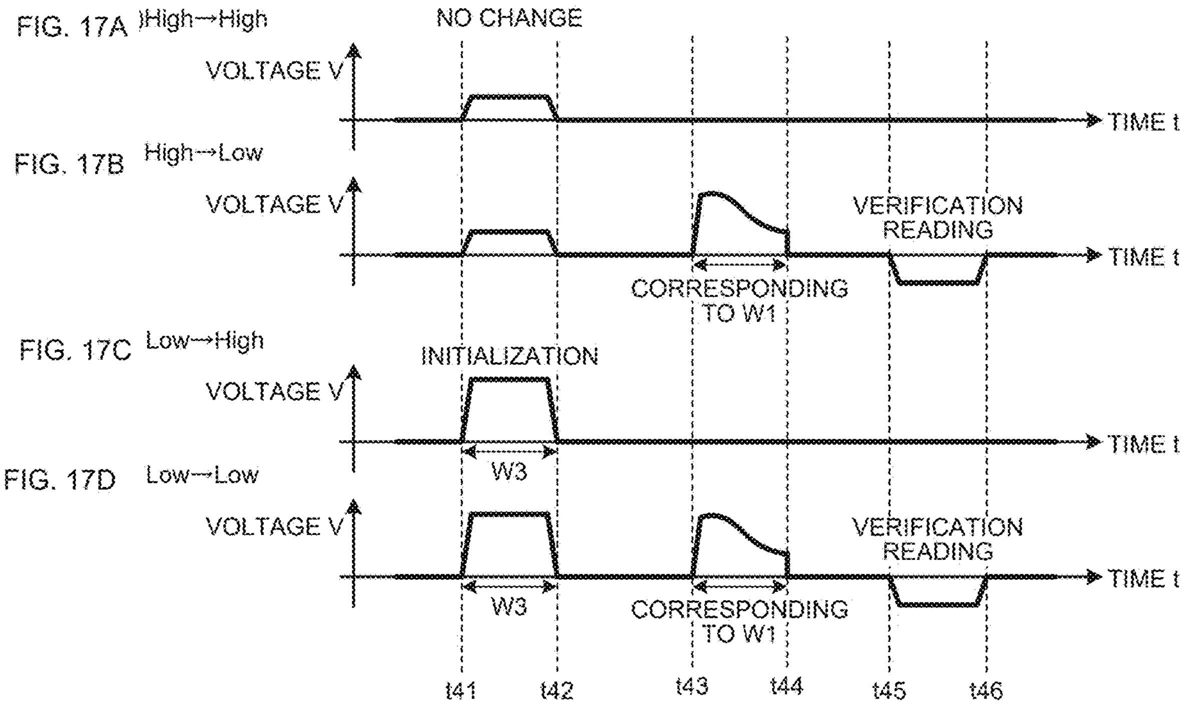
FIGS. 17A, 17B, 17C, and 17D are diagrams schematically illustrating writing of data into a memory cell 10 in the fourth embodiment.

FIGS. 17A, 17B, 17C, and 17D are diagrams schematically illustrating writing of data into the memory cell 10 in the fourth embodiment. In FIG. 17A, data before initialization is "High", and data to be written is also "High". In FIG. 17B, data before initialization is "High", and data to be written is also "Low". In FIG. 17C, data before initialization is "Low", and data to be written is "High". In FIG. 17D, data before initialization is "Low", and data to be written is also "Low".

Initialization is performed from time t41 to time t42. A write circuit 24 initializes the resistance value R of the magnetoresistive element 11 to the high resistance value RHigh by applying a constant voltage V (pulse width W3) to the magnetoresistive element 11. The pulse width W3 of the voltage V here may be longer than the pulse width W2 (FIGS. 7A, 7B, 13A, 13B, 13C, and 13D, and the like). In FIGS. 17A and 17B, the resistance value R of the magnetoresistive element 11 remains at the high resistance value RHigh (no change). In FIGS. 17C and 17D, the resistance value R of the magnetoresistive element 11 is switched from the low resistance value RLow to the high resistance value RHigh.

From time t43 to time t44, data is written as necessary. In FIGS. 17A and 17C, data is not written. In FIGS. 17B and 17D, data is written. A current J (pulse width W1) made constant by a constant current circuit 242 is applied to the magnetoresistive element 11, and the resistance value R of the magnetoresistive element 11 is switched from the high resistance value RHigh to the low resistance value RLow.

From time t45 to time t46, verification reading is performed as necessary. In FIGS. 17A and 17C, verification reading is omitted, and the writing of data ends. However, verification reading may be performed. In FIGS. 17B and 17D, verification reading is performed according to the writing of data at the previous time t43 to time t44. Here, it is assumed that data is successfully written. Therefore, the writing of data ends.

FIGS. 18A and 18B are diagrams illustrating an example of control of writing data into the memory cell 10 in the fourth embodiment. FIG. 18A illustrates control at the time of writing the data "Low". FIG. 18B illustrates control at the time of writing the data "High".

Initialization (Initialize) is performed. The write circuit 24 issues a write pulse (Write Pulse). The write pulse is supplied, via a bit line control circuit 27, to a bit line BL connected to the memory cell 10 into which data is written. The write circuit 24 applies the constant voltage V (pulse width W3) to the magnetoresistive element 11. The resistance value R of the magnetoresistive element 11 is initialized to the high resistance value $R_{High}$.

In FIG. 18A, the data "Low" is written. The write circuit 24 issues a write pulse (Write Pulse). The write circuit 24 applies the current J (pulse width W1) made constant by the constant current circuit 242 to the magnetoresistive element 11. The resistance value R of the magnetoresistive element 11 is switched from the high resistance value RHigh to the low resistance value RLow. Thereafter, verification reading (Verify read) is performed. Here, the comparison result is a mismatch (Result, mismatch), and thus, data is written again. In the subsequent verification reading, the comparison result is matched (Result, match), and the writing of data ends.

Figure 19:
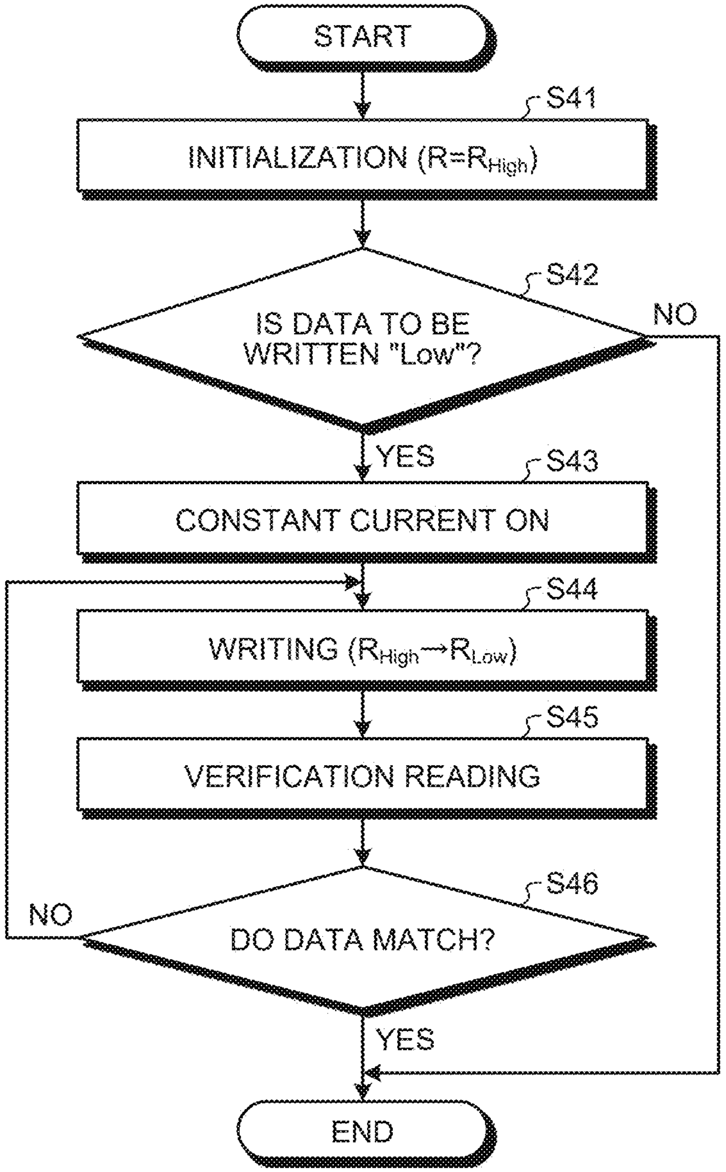
FIG. 19 is a flowchart illustrating an example of processing executed in the magnetoresistive effect memory 100 according to the fourth embodiment.

In FIG. 18B, since the data "High" is written by the above initialization, the writing of data FIG. 19 is a flowchart illustrating an example of processing executed in the magnetoresistive effect memory 100 according to the fourth embodiment.

In Step S41, initialization is performed. The constant voltage V (pulse width W3) is applied to all the magnetoresistive elements 11 (all bits) of the specified address. The resistance value R of the magnetoresistive element 11 is initialized to the high resistance value $R_{High}$.

In Step S42, it is determined whether or not data to be written is "Low". When the data to be written is "Low" (Step S42: Yes), the processing proceeds to Step S43. Otherwise (Step S4: No), the processing of the flowchart ends.

In Step S43, the constant current is turned on. The function of making the current J constant by the constant current circuit 242 is enabled.

In Step S44, data is written. The current J (pulse width W1) controlled to be constant by the constant current circuit 242 is applied to the magnetoresistive element 11. The resistance value R of the magnetoresistive element 11 is switched from the high resistance value $R_{High}$ to the low resistance value $R_{Low}$.

In Step S45, verification reading is performed.

In Step S46, it is determined whether or not the read data matches the data to be written. When they match each other (Step S46: Yes), the processing of the flowchart ends. Otherwise (Step S46: No), the processing returns to Step S44, and the data is written again.

5. Fifth Embodiment

In a fifth embodiment, initial reading is performed, and a resistance value R of a magnetoresistive element 11 is switched between a low resistance value $R_{Low}$ and a high resistance value $R_{High}$ as necessary. For example, when the data "High" is written in Step S16 of FIG. 9 or Step S26 of FIG. 12 described above, a constant voltage V (pulse width W3) is applied to the magnetoresistive element 11, and the resistance value R of the magnetoresistive element 11 is switched from the low resistance value $R_{Low}$ to the high resistance value $R_{High}$.

FIGS. 20A and 20B are diagrams illustrating an example of control of writing data into a memory cell 10 in the fifth embodiment. FIG. 20A illustrates control at the time of writing the data "Low". (B) of FIG. 20B illustrates control at the time of wiring the data "High". FIG. 20A is the same as FIG. 11A described above. FIG. 20B is different from FIG. 11B described above in that the voltage V having the pulse width W3 is applied when the resistance value R is switched from the low resistance value RLow to the high resistance value RHigh. The application of the voltage V having the short pulse width W2 as in FIG. 11B is unnecessary.

6. Example Effects

The techniques described above are specified as follows, for example. One of the disclosed techniques is the magnetoresistive effect memory 100. As described with reference to FIGS. 1, 2, 3A, 3B, 4, 6, 7A, 7B, 8A, 8B, and 9, and the like, the magnetoresistive effect memory 100 includes the magnetoresistive element 11 including the fixed layer 111 whose magnetization direction is fixed and the recording layer 113 whose magnetization direction changes, and the write circuit 24 that reverses the magnetization of the recording layer 113 so that the resistance value R of the magnetoresistive element 11 is switched between the low resistance value RLow and the high resistance value RHigh. The magnetization of the recording layer 113 rotates by the precession around the magnetic field (horizontal magnetic field) in the plane direction (XY plane direction) of the layer when the voltage V is applied to the magnetoresistive element 11. The resistance value R of the magnetoresistive element 11 gradually changes between the low resistance value RLow and the high resistance value RHigh during the rotation of the magnetization of the recording layer 113, and the write circuit 24 reverses the magnetization of the recording layer 113 so that the resistance value R of the magnetoresistive element 11 is switched from the high resistance value RHigh to the low resistance value RLow by applying the current J limited so as to have the predetermined magnitude to the magnetoresistive element 11. The write circuit 24 may apply the limited current J having the pulse width W1 longer than the magnetization reversal period of the recording layer 113 to the magnetoresistive element 11.

In the magnetoresistive effect memory 100 described above, the resistance value R of the magnetoresistive element 11 is switched from the high resistance value $R_{High}$ to the low resistance value $R_{Low}$ by applying the current J limited so as to have the predetermined magnitude to the magnetoresistive element 11. Since the pulse width W1 of the current J may be longer than the magnetization reversal period of the recording layer 113, pulse control for reversing the magnetization of the recording layer 113 is facilitated.

As described with reference to FIGS. 10, 11A, 11B, and 12 and the like, the limited current J may be a constant current. The resistance value R of the magnetoresistive element 11 can also be switched from the high resistance value RHigh to the low resistance value RLow by applying the current J made constant to the magnetoresistive element 11.

As described with reference to FIG. 6 and the like, the write circuit 24 may apply the current J (for example, the current J1 and the current J2) limited in stages so as to have different predetermined magnitudes to the magnetoresistive element 11 during the reversal of magnetization of the recording layer 113. Also by applying such a current J to the magnetoresistive element 11, the resistance value R of the magnetoresistive element 11 can be switched from the high resistance value $R_{High}$ to the low resistance value $R_{Low}$.

As described with reference to FIGS. 7A and 7B and the like, the write circuit 24 may reverse the magnetization of the recording layer 113 so that the resistance value R of the magnetoresistive element 11 is switched from the low resistance value RLow to the high resistance value RHigh by applying the constant voltage V to the magnetoresistive element 11. In that case, the write circuit 24 may apply the constant voltage V having the pulse width W2 which is the same as the magnetization reversal period of the recording layer 113 to the magnetoresistive element 11. For example, in this manner, the resistance value R of the magnetoresistive element 11 can be set to the high resistance value RHigh.

As described with reference to FIGS. 1, 7A, 7B, 8A, 8B, and 9, and the like, the magnetoresistive effect memory 100 may include the read circuit 25 that detects the resistance value R of the magnetoresistive element 11 by applying a voltage at which the magnetization of the recording layer 113 is not reversed to the magnetoresistive element 11. In that case, the write circuit 24 may reverse the magnetization of the recording layer 113 so that the resistance value R of the magnetoresistive element 11 is switched from the high resistance value RHigh to the low resistance value RLow by applying the limited current J to the magnetoresistive element 11 whose resistance value R is detected to be the high resistance value RHigh by the read circuit 25. In this manner, data can be written into the memory cell 10 by switching the resistance value R of the magnetoresistive element 11 as necessary after initial reading is performed.

As described with reference to FIGS. 13A, 13B, 13C, 13D, 14A, 14B, and 15 and the like, the write circuit 24 may initialize the resistance value R of the magnetoresistive element 11 to the low resistance value RLow by applying the limited current J to the magnetoresistive element 11, and may reverse the magnetization of the recording layer 113 so that the resistance value R of the magnetoresistive element 11 is switched from the low resistance value RLow to the high resistance value RHigh by applying the constant voltage V to the magnetoresistive element 11 after initialization. By performing the initialization, the initial reading becomes unnecessary.

As described with reference to FIGS. 1, 2, 3A, 3B, 4, 6, 7A, 7B, 8A, 8B, and 9, and the like, the write circuit 24 may detect the resistance value R of the magnetoresistive element 11 by applying a low voltage at which the magnetization of the recording layer 113 is not reversed to the magnetoresistive element 11 in order to determine whether or not the switching of the resistance value R of the magnetoresistive element 11 by the write circuit 24 is successful. In this manner, verification reading can also be performed.

As described with reference to FIGS. 16, 17A, 17B, 17C, 17D, 18A, 18B, 19, 20A, and 20B and the like, the magnetization of the recording layer 113 may rotates by the precession around the magnetic field (horizontal magnetic field) in the plane direction of the layer in the magnetic field (perpendicular magnetic field) perpendicular to the plane direction of the layer (in the Z-axis direction), and the write circuit 24 may apply the constant voltage V having the pulse width W3 longer than the magnetization reversal period of the recording layer 113 to the magnetoresistive element 11. This also facilitates pulse control of the voltage V when the resistance value R of the magnetoresistive element 11 is switched from the low resistance value RLow to the high resistance value RHigh. The effect of facilitating the pulse control for reversing the magnetization of a recording layer 113 is further enhanced.

As described with reference to FIGS. 17A, 17B, 17C, 17D, 18A, 18B, and 19 and the like, the write circuit 24 may initialize the resistance value R of the magnetoresistive element 11 to the high resistance value RHigh by applying the constant voltage V to the magnetoresistive element 11, and may reverse the magnetization of the recording layer 113 so that the resistance value R of the magnetoresistive element 11 is switched from the high resistance value RHigh to the low resistance value RLow by applying the limited current J to the magnetoresistive element 11 after initialization. By performing the initialization, the initial reading becomes unnecessary.

Note that the effects described in the present disclosure are merely examples and are not limited to the disclosed contents. There may be other effects.

Although the embodiments of the present disclosure have been described above, the technical scope of the present disclosure is not limited to the above-described embodiments as they are, and various modifications can be made without departing from the gist of the present disclosure. In addition, components of different embodiments and modifications may be appropriately combined.

Note that the present technique can also have the following configurations.

(1) A magnetoresistive effect memory comprising:

a magnetoresistive element including a fixed layer whose magnetization direction is fixed and a recording layer whose magnetization direction changes; and a write circuit that reverses magnetization of the recording layer so that a resistance value of the magnetoresistive element is switched between a low resistance value and a high resistance value, wherein the magnetization of the recording layer rotates by precession around a magnetic field in a plane direction of the layer when a voltage is applied to the magnetoresistive element, the resistance value of the magnetoresistive element gradually changes between the low resistance value and the high resistance value during the rotation of the magnetization of the recording layer, and the write circuit reverses the magnetization of the recording layer so that the resistance value of the magnetoresistive element is switched from the high resistance value to the low resistance value by applying a current limited so as to have a predetermined magnitude to the magnetoresistive element.

(2) The magnetoresistive effect memory according to (1), wherein the write circuit applies the limited current having a pulse width longer than a magnetization reversal period of the recording layer to the magnetoresistive element.

(3) The magnetoresistive effect memory according to (1) or (2), wherein the limited current is a constant current.

(4) The magnetoresistive effect memory according to any one of (1) to (3), wherein the write circuit applies a current limited in stages so as to have different predetermined magnitudes to the magnetoresistive element during a reversal of the magnetization of the recording layer.

(5) The magnetoresistive effect memory according to any one of (1) to (4), wherein the write circuit reverses the magnetization of the recording layer so that the resistance value of the magnetoresistive element is switched from the low resistance value to the high resistance value by applying a constant voltage to the magnetoresistive element.

(6) The magnetoresistive effect memory according to (5), wherein the write circuit applies the constant voltage having a pulse width that is the same as a magnetization reversal period of the recording layer to the magnetoresistive element.

(7) The magnetoresistive effect memory according to any one of (1) to (6), further comprising a read circuit that detects the resistance value of the magnetoresistive element by applying a voltage at which the magnetization of the recording layer is not reversed to the magnetoresistive element.

(8) The magnetoresistive effect memory according to (7), wherein the write circuit reverses the magnetization of the recording layer so that the resistance value of the magnetoresistive element is switched from the high resistance value to the low resistance value by applying the limited current to the magnetoresistive element whose resistance value is detected to be the high resistance value by the read circuit.

(9) The magnetoresistive effect memory according to any one of (1) to (6), wherein the write circuit initializes the resistance value of the magnetoresistive element to the low resistance value by applying the limited current to the magnetoresistive element, and reverses the magnetization of the recording layer so that the resistance value of the magnetoresistive element is switched from the low resistance value to the high resistance value by applying a constant voltage to the magnetoresistive element after initialization.

(10) The magnetoresistive effect memory according to any one of (1) to (9), further comprising a read circuit that detects the resistance value of the magnetoresistive element by applying a low voltage at which the magnetization of the recording layer is not reversed to the magnetoresistive element in order to determine whether or not switching of the resistance value of the magnetoresistive element by the write circuit is successful.

(11) The magnetoresistive effect memory according to (5), in which the magnetization of the recording layer rotates by the precession around the magnetic field in the plane direction of the layer in a magnetic field perpendicular to the plane direction of the layer, and the write circuit applies the constant voltage having a pulse width longer than a magnetization reversal period of the recording layer to the magnetoresistive element.

(12) The magnetoresistive effect memory according to (11), in which the write circuit initializes the resistance value of the magnetoresistive element to the high resistance value by applying the constant voltage to the magnetoresistive element, and reverses the magnetization of the recording layer so that the resistance value of the magnetoresistive element is switched from the high resistance value to the low resistance value by applying the limited current to the magnetoresistive element after initialization.

REFERENCE SIGNS LIST

100 MAGNETORESISTIVE EFFECT MEMORY
1 MEMORY CELL ARRAY
10 MEMORY CELL
11 MAGNETORESISTIVE ELEMENT
111 FIXED LAYER
112 TUNNEL BARRIER LAYER
113 RECORDING LAYER
114 MAGNETIC FIELD GENERATION LAYER
115 MAGNETIC FIELD GENERATION LAYER
12 SELECTION TRANSISTOR
21 I/O
22 CONTROL CIRCUIT
23 VOLTAGE GENERATION CIRCUIT
24 WRITE CIRCUIT
241 CURRENT LIMITING CIRCUIT
242 CONSTANT CURRENT CIRCUIT
25 READ CIRCUIT
26 BIT LINE ADDRESS DECODER
27 BIT LINE CONTROL CIRCUIT
28 WORD LINE ADDRESS DECODER
29 WORD LINE CONTROL CIRCUIT
30 SENSE AMPLIFIER
J CURRENT
J1 CURRENT
J2 CURRENT
Ku PERPENDICULAR MAGNETIC ANISOTROPY CONSTANT
V VOLTAGE
BL BIT LINE
SL SOURCE LINE
WL WORD LINE
W1 PULSE WIDTH
W2 PULSE WIDTH
W3 PULSE WIDTH
WE PULSE WIDTH

The invention claimed is:

1. A magnetoresistive effect memory, comprising:

a magnetoresistive element including a fixed layer whose magnetization direction is fixed and a recording layer whose magnetization direction changes; and a write circuit configured to reverse magnetization of the recording layer so that a resistance value of the magnetoresistive element is switched between a low resistance value and a high resistance value, wherein the magnetization of the recording layer rotates by precession around a magnetic field in a plane direction of the recording layer in a case where a voltage is applied to the magnetoresistive element, the resistance value of the magnetoresistive element gradually changes between the low resistance value and the high resistance value during the rotation of the magnetization of the recording layer, and the write circuit is further configured to reverse the magnetization of the recording layer so that the resistance value of the magnetoresistive element is switched from the high resistance value to the low resistance value based on application of a limited current so as to have a specific magnitude to the magnetoresistive element.

2. The magnetoresistive effect memory according to claim 1, wherein the write circuit is further configured to apply the limited current having a pulse width longer than a magnetization reversal period of the recording layer to the magnetoresistive element.

3. The magnetoresistive effect memory according to claim 1, wherein the limited current is a constant current.

4. The magnetoresistive effect memory according to claim 1, wherein the write circuit is further configured to apply the limited current in stages so as to have different specific magnitudes to the magnetoresistive element during the reversal of the magnetization of the recording layer.

5. The magnetoresistive effect memory according to claim 1, wherein the write circuit is further configured to reverse the magnetization of the recording layer so that the resistance value of the magnetoresistive element is switched from the low resistance value to the high resistance value based on application of a constant voltage to the magnetoresistive element.

6. The magnetoresistive effect memory according to claim 5, wherein the write circuit is further configured to apply the constant voltage having a pulse width that is the same as a magnetization reversal period of the recording layer to the magnetoresistive element.

7. The magnetoresistive effect memory according to claim 1, further comprising a read circuit configured to detect the resistance value of the magnetoresistive element based on application of a voltage at which the magnetization of the recording layer is not reversed to the magnetoresistive element.

8. The magnetoresistive effect memory according to claim 7, wherein the write circuit is further configured to reverse the magnetization of the recording layer so that the resistance value of the magnetoresistive element is switched from the high resistance value to the low resistance value based on application of the limited current to the magnetoresistive element, and the read circuit is further configured to detect the high resistance value of the magnetoresistive element.

9. The magnetoresistive effect memory according to claim 1, wherein the write circuit is further configured to:

initialize the resistance value of the magnetoresistive element to the low resistance value based on application of the limited current to the magnetoresistive element, and reverse the magnetization of the recording layer so that the resistance value of the magnetoresistive element is switched from the low resistance value to the high resistance value based on application of a constant voltage to the magnetoresistive element after initialization.

10. The magnetoresistive effect memory according to claim 1, further comprising a read circuit configured to:

detect the resistance value of the magnetoresistive element based on application of a low voltage at which the magnetization of the recording layer is not reversed to the magnetoresistive element, and determine whether the write circuit successfully switches the resistance value of the magnetoresistive element based on the detected resistance value.

* * * * *